United States Patent
Chen et al.

(10) Patent No.: US 9,921,677 B1
(45) Date of Patent: Mar. 20, 2018

(54) METHOD FOR FABRICATING TOUCH DISPLAY DEVICE

(71) Applicant: Au Optronics Corporation, Hsinchu (TW)

(72) Inventors: Shin-Shueh Chen, Hsinchu County (TW); Yi-Wei Chen, Hsinchu County (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 15/644,837

(22) Filed: Jul. 10, 2017

(30) Foreign Application Priority Data

May 3, 2017 (TW) .............................. 106114659 A

(51) Int. Cl.
*H01L 27/12* (2006.01)
*G06F 3/041* (2006.01)
(Continued)

(52) U.S. Cl.
CPC .......... *G06F 3/0412* (2013.01); *G02F 1/1368* (2013.01); *G02F 1/13338* (2013.01); *G02F 1/133345* (2013.01); *G02F 1/136209* (2013.01); *G02F 1/136286* (2013.01); *G06F 3/042* (2013.01); *H01L 27/127* (2013.01); *H01L 29/4908* (2013.01); *G02F 1/136213* (2013.01); *G02F 1/136227* (2013.01);
(Continued)

(58) Field of Classification Search
CPC ............... H01L 27/1259; H01L 27/127; H01L 27/1214; H01L 29/78633; H01L 29/78618; H01L 29/4908; H01L 29/66606; H01L 29/66545; G06F 3/0412; G06F 3/042; G06F 2203/04103; G02F 1/133345; G02F 1/13338; G02F 1/136209; G02F 1/136286; G02F 1/1368; G02F 2001/13685
See application file for complete search history.

(56) References Cited

U.S. PATENT DOCUMENTS 8,345,134 B2   1/2013  Smith et al.
9,230,993 B2 * 1/2016  Tanaka ................ H01L 27/1222
(Continued)

FOREIGN PATENT DOCUMENTS

CN   105977268   9/2016
TW   201201392   1/2012

*Primary Examiner* — Michael Trinh
(74) *Attorney, Agent, or Firm* — JCIPRNET

(57) ABSTRACT

A method for fabricating a touch display device is provided. The method includes: forming a sensor on a substrate, and forming a sensing signal line electrically connected to the sensor. The method of forming the sensor includes: forming a semiconductor layer including a semiconductor pattern of the sensor on the substrate, forming a gate insulation layer on the semiconductor layer, forming a first conductor layer on the gate insulation layer, forming an interlayered insulation layer on the gate insulation layer, performing an annealing process, removing the interlayered insulation layer on a gate predetermined region after the annealing process is performed, removing the first conductor layer on the gate predetermined region, forming a gate in the gate predetermined region, and forming a second conductor layer including a source and a drain of the sensor respectively electrically connected to the semiconductor pattern of the sensor.

12 Claims, 24 Drawing Sheets

(51) Int. Cl.
  *G02F 1/1368* (2006.01)
  *G02F 1/1362* (2006.01)
  *G02F 1/1333* (2006.01)
  *G06F 3/042* (2006.01)
  *H01L 29/49* (2006.01)
  *H01L 29/786* (2006.01)

(52) U.S. Cl.
  CPC ............ *G02F 2001/13685* (2013.01); *G02F 2001/133357* (2013.01); *G02F 2201/121* (2013.01); *G02F 2201/123* (2013.01); *G02F 2202/104* (2013.01); *G06F 2203/04103* (2013.01); *H01L 27/1214* (2013.01); *H01L 29/78633* (2013.01)

(56) References Cited

U.S. PATENT DOCUMENTS

| | | | | |
|---|---|---|---|---|
| 2002/0179908 | A1* | 12/2002 | Arao | H01L 27/1214 257/72 |
| 2011/0032444 | A1* | 2/2011 | Yamazaki | H01L 27/1225 349/42 |
| 2016/0079286 | A1* | 3/2016 | Jin | H01L 29/66742 257/71 |

* cited by examiner

ମETHOD FOR FABRICATING TOUCH
DISPLAY DEVICE

CROSS-REFERENCE TO RELATED
APPLICATION

This application claims the priority benefit of Taiwan application serial no. 106114659, filed on May 3, 2017. The entirety of the above-mentioned patent application is hereby incorporated by reference herein and made a part of this specification.

BACKGROUND OF THE INVENTION

Field of the Invention

The invention relates to a method for fabricating a display device.

Description of Related Art

According to the existing on-cell touch display technology, a touch element is required to be arranged on the exterior to the display for performing a touch sensing operation. Therefore, as the screen size enlarges, decrease of production yield and the increase of manufacturing costs will occur. In contrast, the in-cell optical touch technology supports multi-touch and directly embeds a touch sensor in an array substrate of a liquid crystal display (LCD), whereby the in-cell LCD may be produced within the current capacity only by adjusting the manufacturing process of photomasks without the need of any additional enormous capital investment. Accordingly, the in-cell optical touch technology allows the reduction of the cost for adhesion and assembly and the reduction of thickness and weight of the device, thereby having the advantages of high yield, low cost, and no limitation to the size of the device.

SUMMARY OF THE INVENTION

An embodiment of the invention provides a method for fabricating a touch display device that allows a sensor in the touch display device to have good sensing performance.

In an embodiment of the invention, a method for fabricating a touch display device includes following steps: forming a sensor on a substrate, and forming a sensing signal line electrically connected to the sensor. A method of forming the sensor includes following steps: forming a semiconductor layer including a semiconductor pattern of the sensor on the substrate, forming a gate insulation layer on the semiconductor layer, forming a first conductor layer on the gate insulation layer, forming an interlayered insulation layer on the gate insulation layer, performing an annealing process, removing the interlayered insulation layer at a gate predetermined region after the annealing process is performed, removing the first conductor layer at the gate predetermined region, forming a gate at the gate predetermined region, and forming a second conductor layer. The second conductor layer includes a source and a drain of the sensor which are respectively electrically connected to the semiconductor pattern of the sensor.

Based on the above, in the method for fabricating the touch display device according to an embodiment of the invention, the gate of the sensor is formed after the annealing process is completed, and the annealing process is performed after the interlayered insulation layer is formed. Thereby, not only the semiconductor layer may be hydrogenized, but also the gate of the sensor does not encounter the issue of reduction and precipitation of metal atoms and the issue of peeling. Accordingly, the sensor can have good carrier mobility, luminous flux, and structural stability and thereby have good sensing performance, for example, good photosensitivity.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DESCRIPTION OF THE EMBODIMENTS

The touch display device of the invention is, for example, a touch liquid crystal display (LCD) device. People having ordinary skills in the art should be able to understand that the touch LCD device generally includes a pixel array formed by a plurality of identical or similar pixel units arranged in an array. For the clarity of description, only one pixel unit U is shown in FIG. 1.

Figure 1:
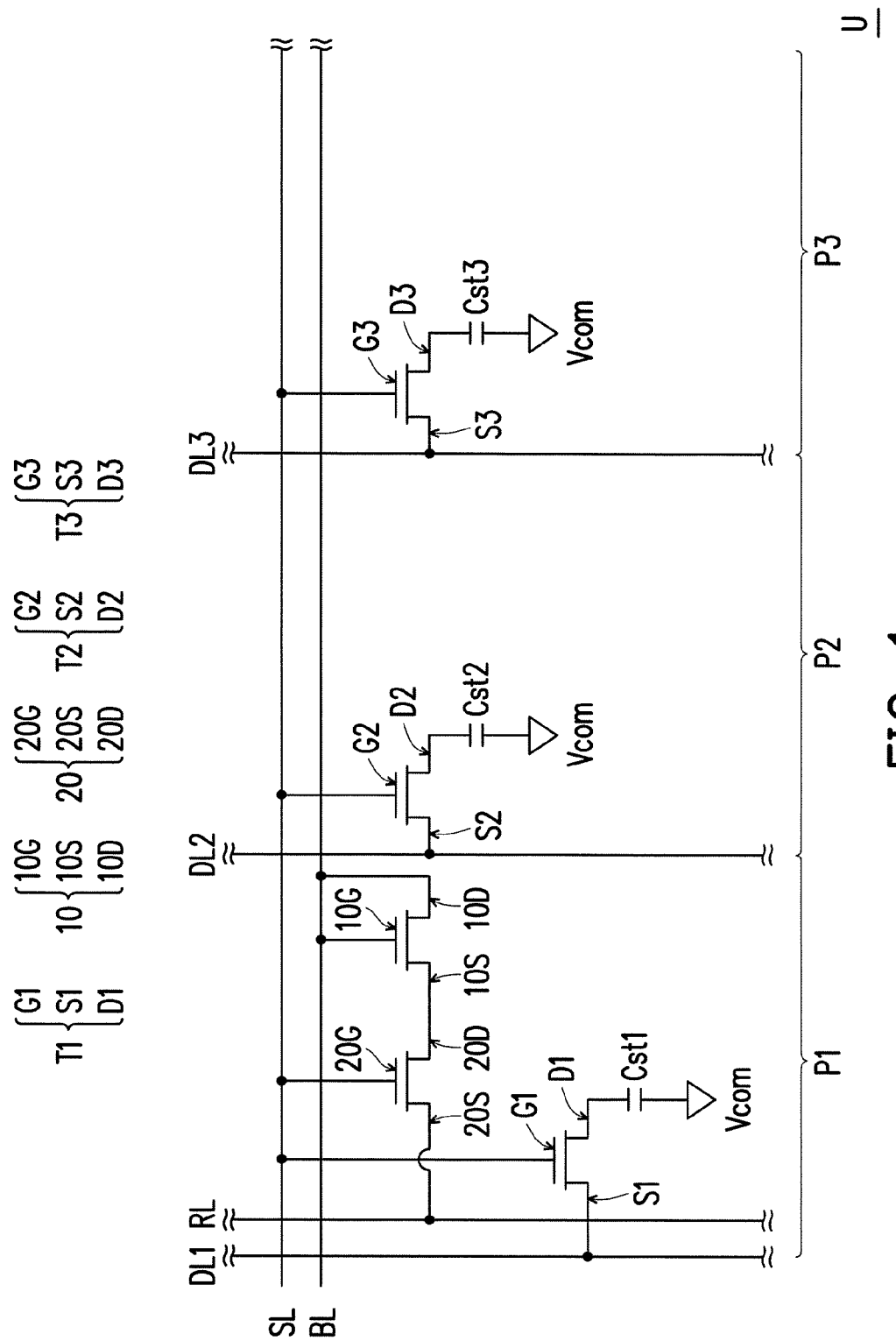
FIG. 1 is a partial equivalent-circuit diagram of a touch display device according to an embodiment of the invention.

FIG. 1 is a partial equivalent-circuit diagram of a touch display device according to an embodiment of the invention. As shown in FIG. 1, the pixel unit U of the touch display device includes scan line SL, data lines DL1 to DL3, sensing signal line BL, read-out line RL, sub-pixel unit P1, sub-pixel unit P2, and sub-pixel unit P3.

Figure 2:
FIG. 2 is a schematic view of fingerprint information detected by a touch display device according to an embodiment of the invention.

In this embodiment, the sub-pixel unit P1 includes active element T1, sensor 10, switch 20, and capacitor Cst1, the sub-pixel unit P2 includes active element T2 and capacitor Cst2, and the sub-pixel unit P3 includes active element T3 and capacitor Cst3. In this embodiment, one sensor 10 is disposed in one pixel unit U. The touch display device of the embodiment of the invention including the pixel unit U adopts the in-cell optical touch technology. The sensor 10 may be configured to detect fingerprints. The touch display device has a plurality of pixel units U, i.e., plural sensors 10 are distributed in the touch display device, wherein the sensors 10 can sense and detect fingerprint information. The fingerprint information sensed and detected by the touch display device is shown in FIG. 2.

In this embodiment, in the sub-pixel unit P1, gate G1 of the active element T1 is electrically connected to the scan line SL, source S1 of the active element T1 is electrically connected to the data line DL1, drain D1 of the active element T1 is electrically connected to the capacitor Cst1, first pixel electrode electrically connected to the drain D1 of the active element T1 and common electrode electrically connected to common voltage Vcom together form the capacitor Cst1, gate 10G of the sensor 10 is electrically connected to the sensing signal line BL, source 10S of the sensor 10 is electrically connected to drain 20D of the switch 20, drain 10D of the sensor 10 is electrically connected to the sensing signal line BL, gate 20G of the switch 20 is electrically connected to the scan line SL, and source 20S of the switch 20 is electrically connected to the read-out line RL.

In addition, in this embodiment, in the sub-pixel unit P2, gate G2 of the active element T2 is electrically connected to the scan line SL, source S2 of the active element T2 is electrically connected to the data line DL2, drain D2 of the active element T2 is electrically connected to the capacitor Cst2, and second pixel electrode electrically connected to the drain D2 of the active element T2 and common electrode electrically connected to the common voltage Vcom together form the capacitor Cst2.

In addition, in this embodiment, in the sub-pixel unit P3, gate G3 of the active element T3 is electrically connected to the scan line SL, source S3 of the active element T3 is electrically connected to the data line DL3, drain D3 of the active element T3 is electrically connected to the capacitor Cst3, and third pixel electrode electrically connected to the drain D3 of the active element T3 and a common electrode electrically connected to the common voltage Vcom together form the capacitor Cst3.

Although FIG. 1 discloses that the sensor 10 and the switch 20 are disposed in the sub-pixel unit P1, the invention is not limited thereto. In other embodiments, the sensor 10 and the switch 20 can also be disposed in the sub-pixel unit P2 or in the sub-pixel unit P3. In other embodiments, at least two of the sub-pixel units P1, P2, and P3 may be electrically connected to different scan lines and/or different data lines.

To achieve good sensing performance of the sensor 10, for example, good photosensitivity, a method for fabricating a touch display device to achieve said advantages by adjusting steps of the method is provided. Based on the above, the way to arrange each component in the pixel unit U is not specifically limited herein. Several embodiments of the invention are exemplarily provided below to prove that the invention may be implemented accordingly. It should be mentioned that, to clearly describe the features of the invention, FIG. 3A to FIG. 3K and FIG. 4 only elaborate the sub-pixel unit P1, and people having ordinary skills in the art should be able to understand the structures, the manufacturing methods, and other relevant descriptions of the sub-pixel unit P2 and the sub-pixel unit P3 according to the following descriptions of the sub-pixel unit P1.

Figure 3A:
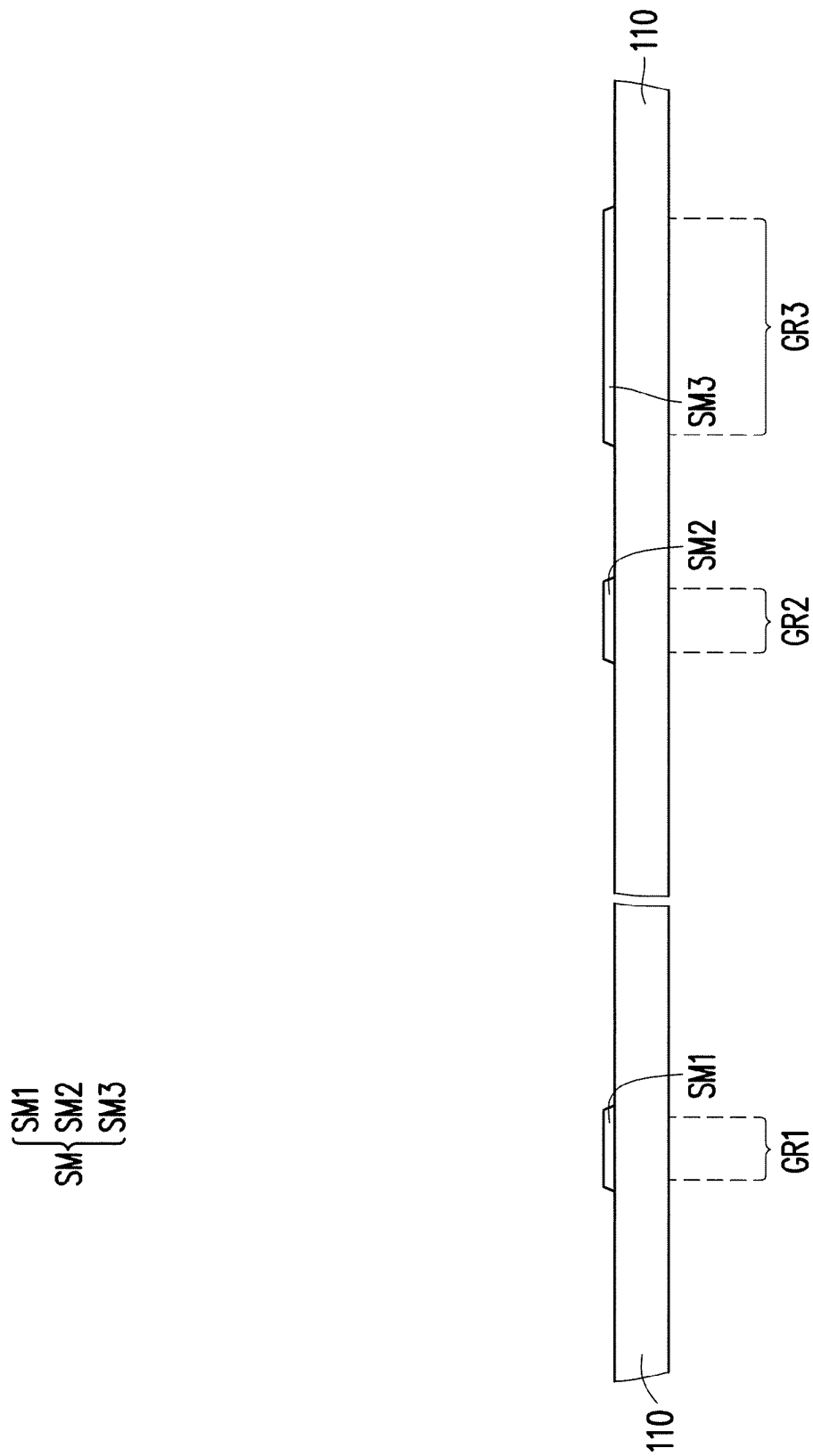
FIG. 3A to FIG. 3K are schematic cross-sectional views of a process for fabricating a touch display device according to a first embodiment of the invention.
Figure 3B:
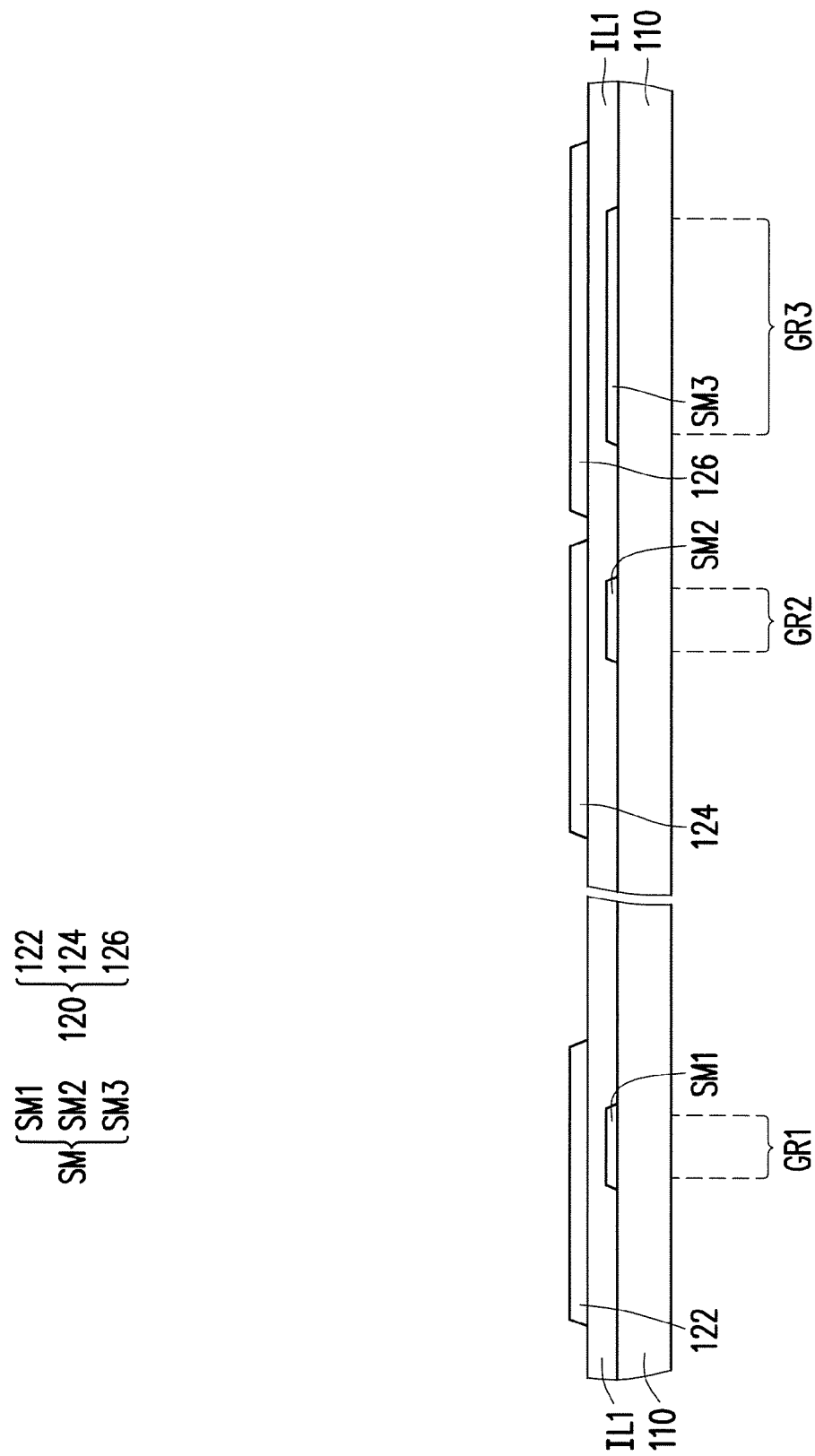
Figure 3C:
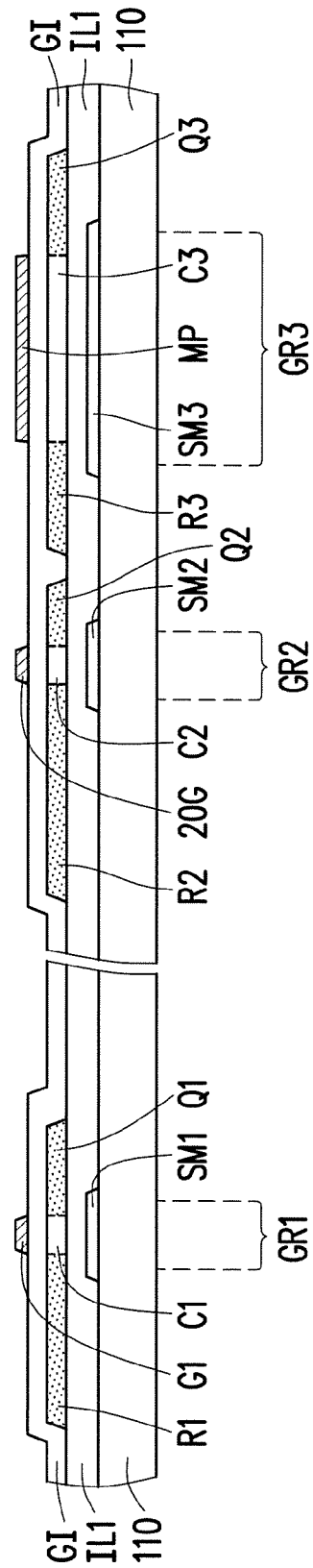
Figure 3D:
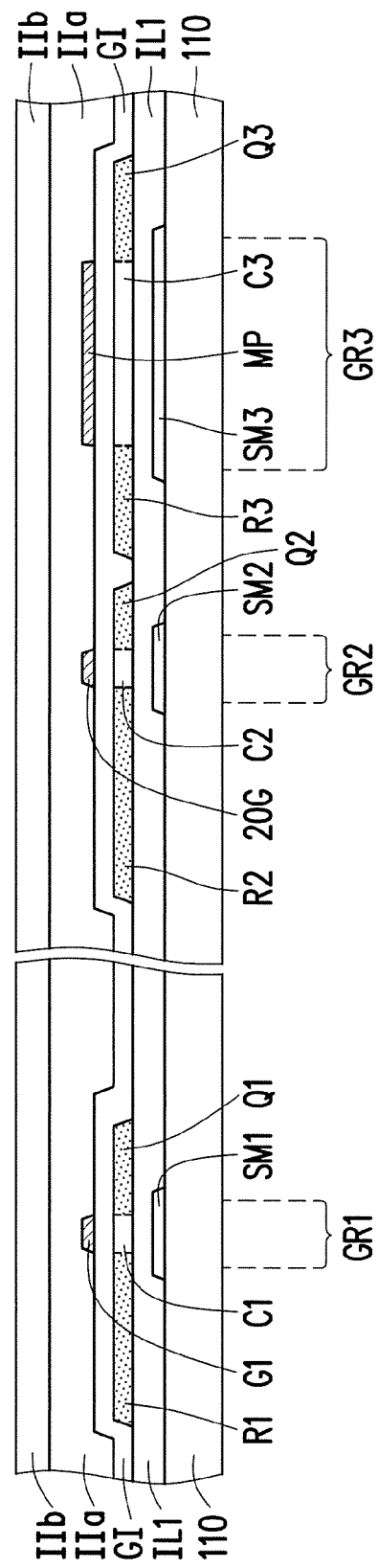
Figure 3E:
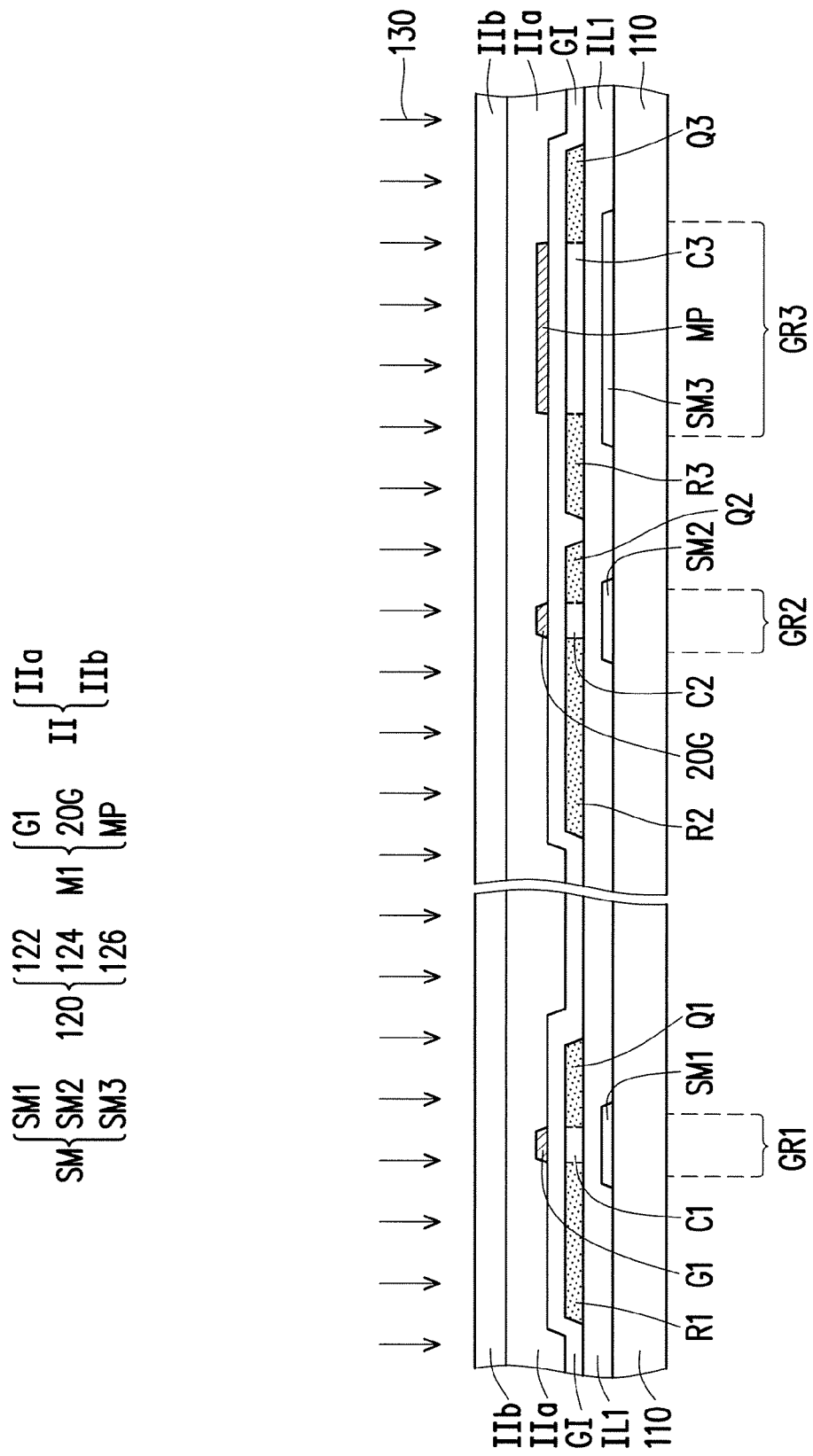
Figure 3F:
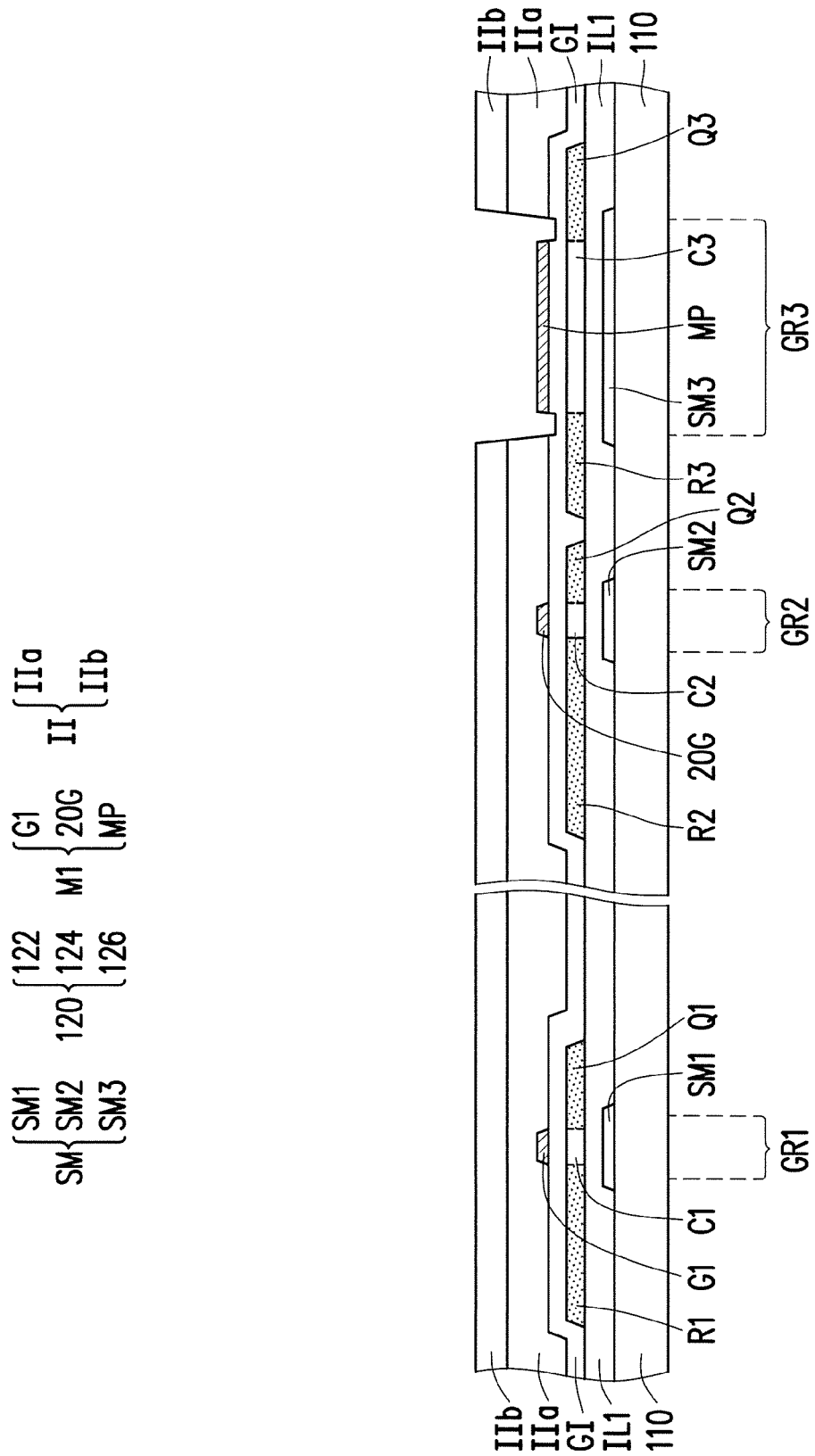
Figure 3G:
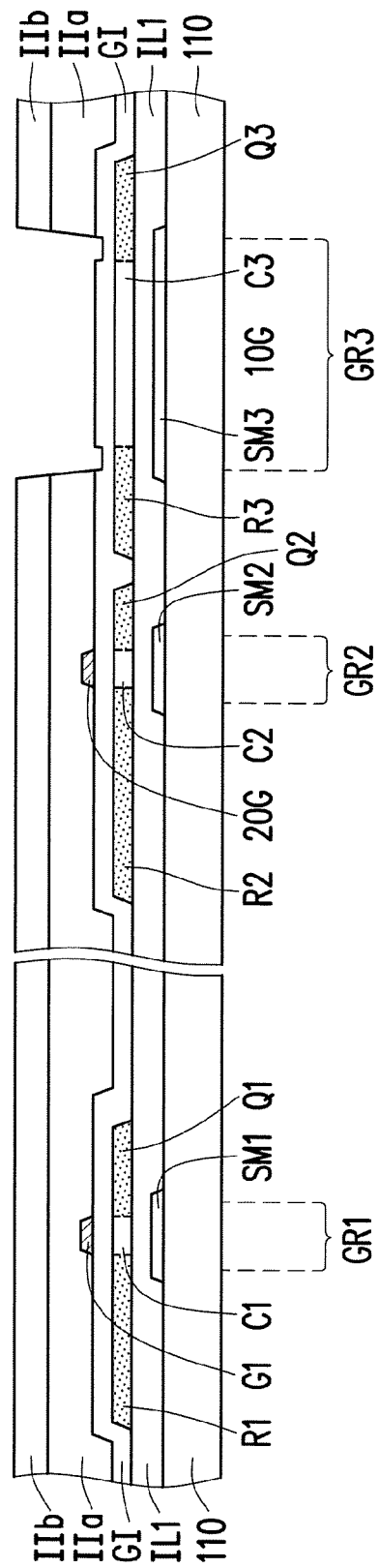
Figure 3H:
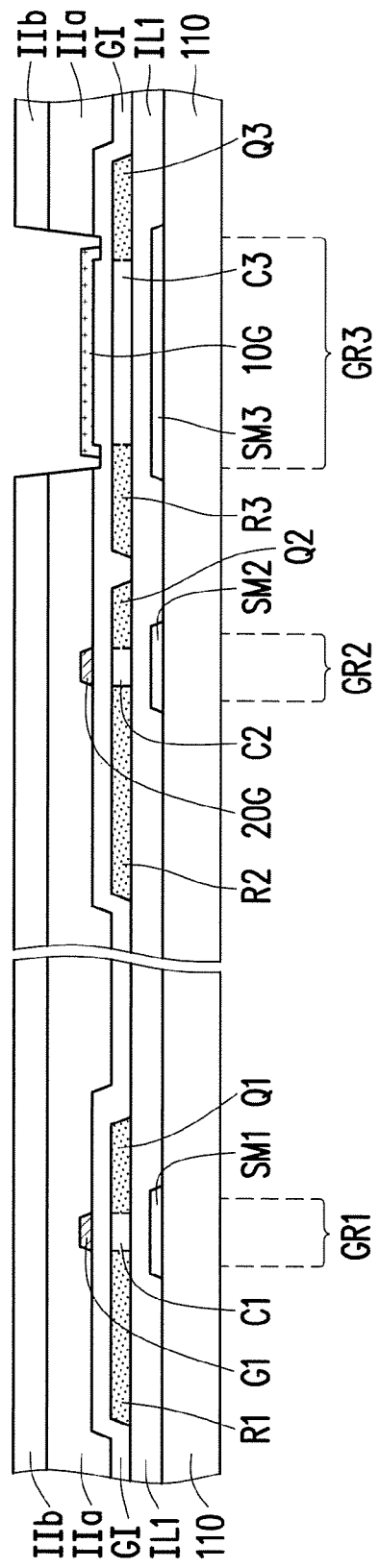
Figure 3I:
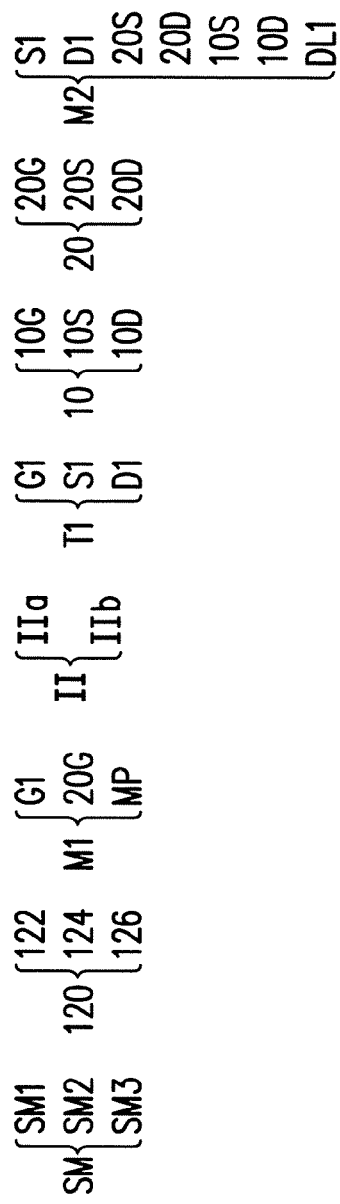
Figure 3I:
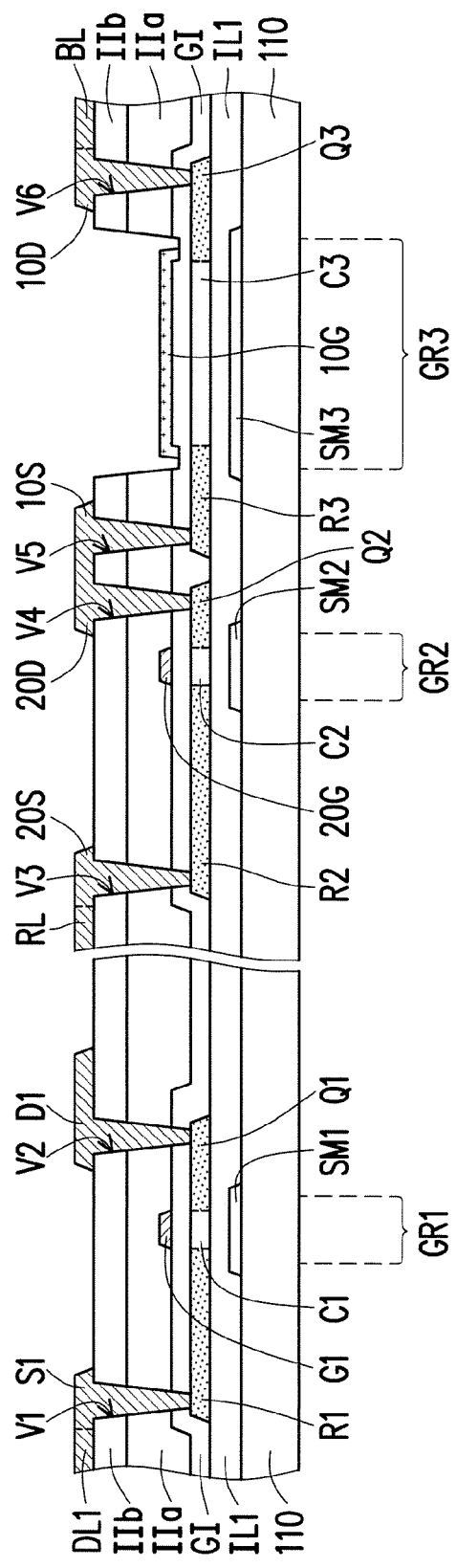
Figure 3J:
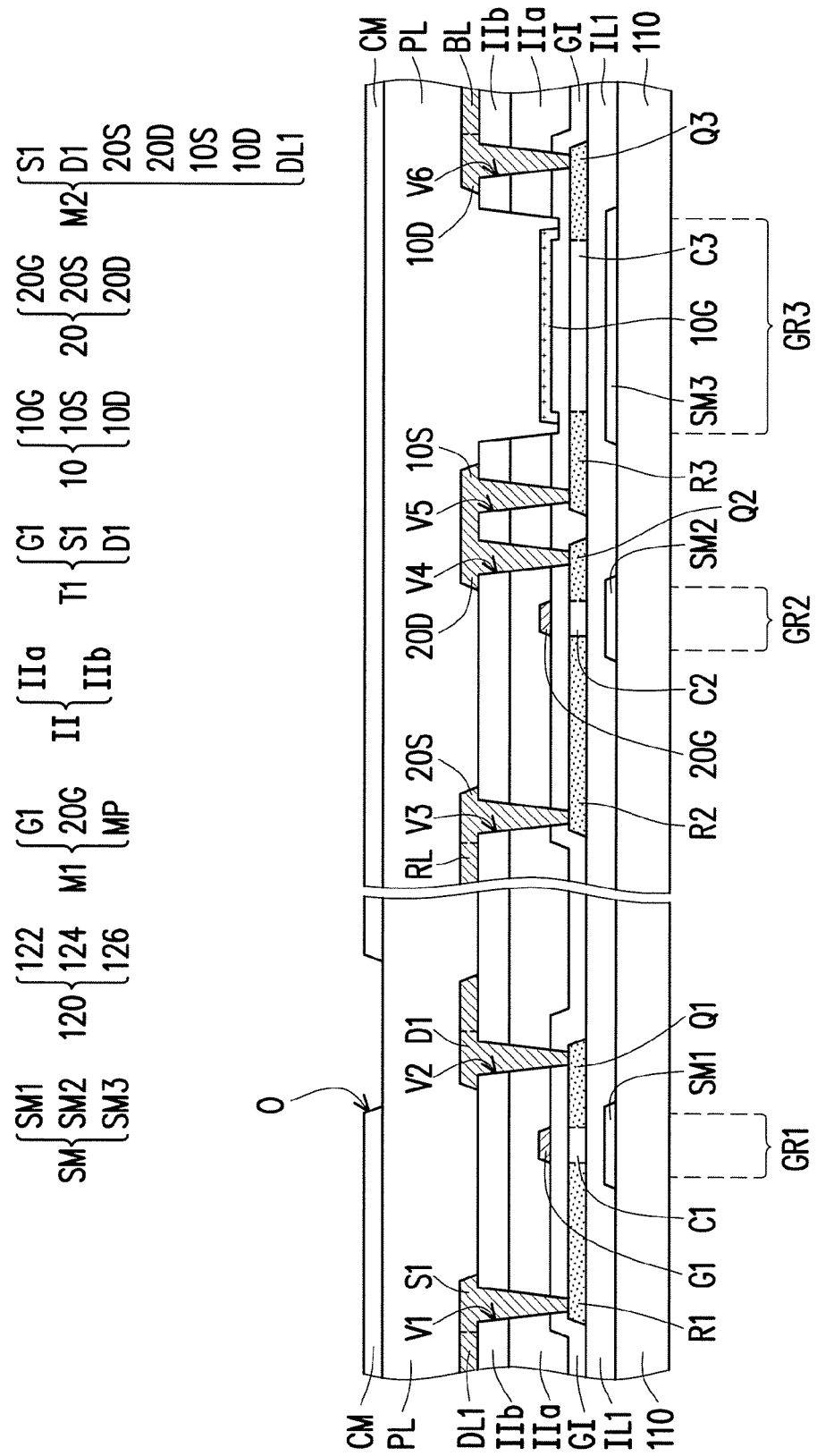
Figure 3K:
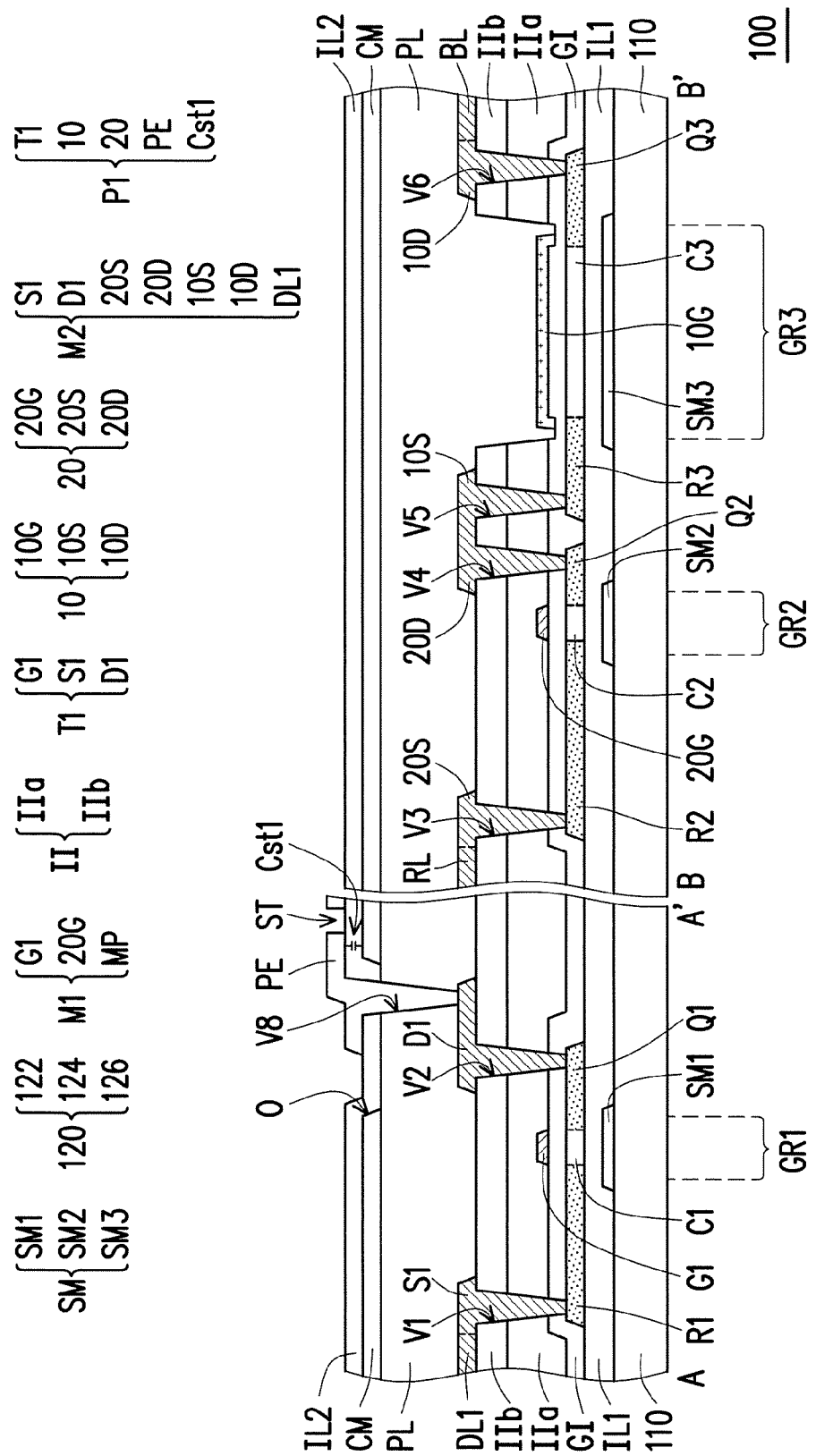
Figure 4:
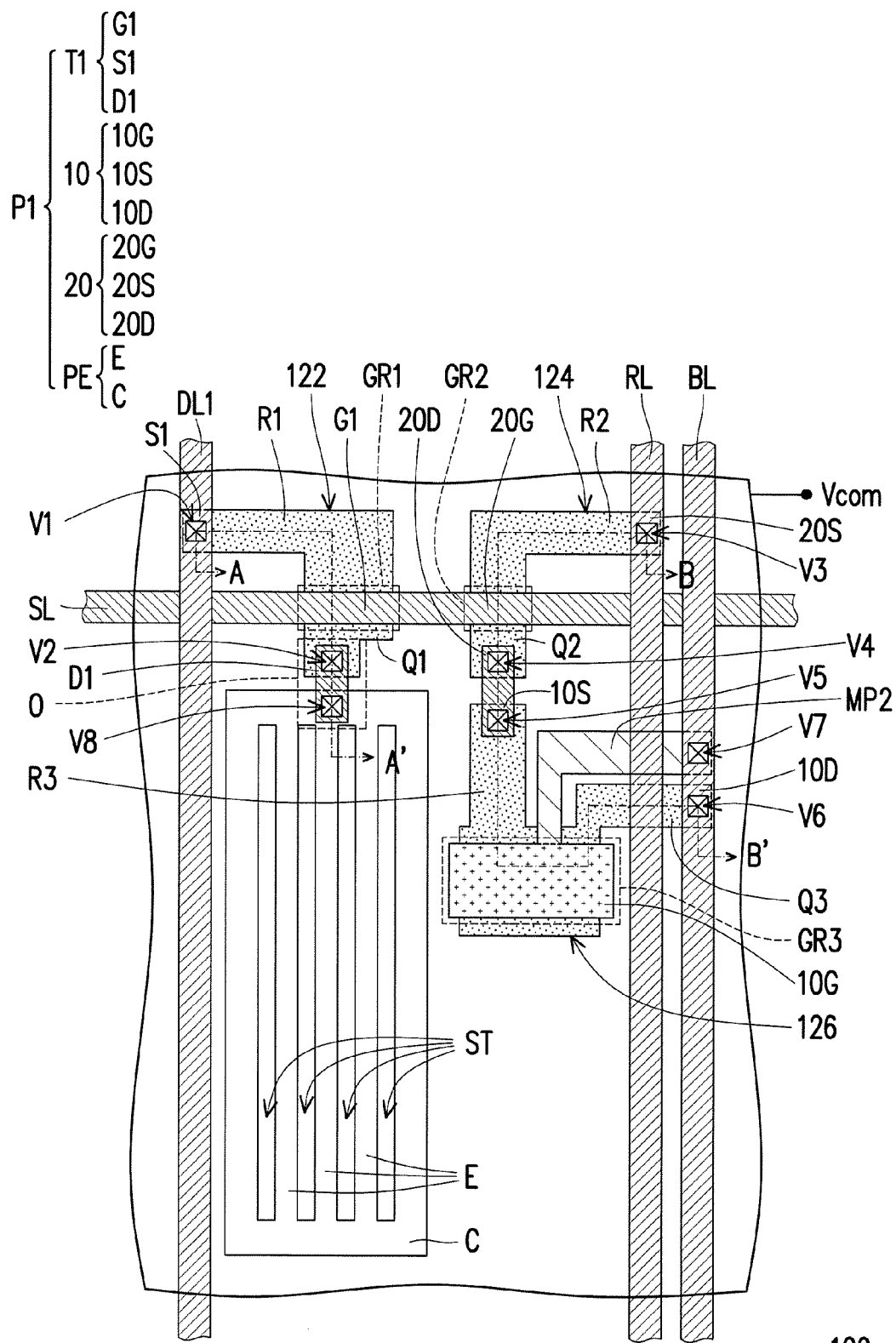
FIG. 4 is a schematic top view of a portion of the touch display device according to the first embodiment of the invention.

FIG. 3A to FIG. 3K are schematic cross-sectional views of a process for fabricating a touch display device according to a first embodiment of the invention. FIG. 4 is a schematic top view of a portion of the touch display device according to the first embodiment of the invention. Note that FIG. 3K is a schematic cross-sectional view taken along a sectional line A-A' and a sectional line B-B' of FIG. 4, and the cross-section depicted in FIG. 3A to FIG. 3J can also be located according to the position of the sectional line A-A' and the sectional line B-B' in FIG. 4. For illustrative purposes, some film layers are omitted in FIG. 4 to clearly illustrate the arrangement of the film layers.

As shown in FIG. 3A, shielding layer SM is formed on substrate 110. In this embodiment, the substrate 110 has a gate predetermined region GR1, gate predetermined region GR2, and gate predetermined region GR3, and the shielding layer SM includes shielding pattern SM1, shielding pattern SM2, and shielding pattern SM3 respectively corresponding to the gate predetermined region GR1, the gate predetermined region GR2, and the gate predetermined region GR3. The gate predetermined region GR1, the gate predetermined region GR2, and the gate predetermined region GR3 can respectively overlap with the corresponding shielding patterns SM1, SM2, and SM3 partially or completely. In this embodiment, the substrate 110 may be a rigid substrate, such as a glass substrate, a quartz substrate, or a silicon substrate, or may be a flexible substrate, such as a polymer substrate or a plastic substrate. In this embodiment, the material of the shielding layer SM may include any light shielding material commonly known to people having ordinary skills in the art, e.g., molybdenum, molybdenum-aluminum-molybdenum, titanium-aluminum-titanium, or other metals which do not allow light to pass through. In this embodiment, the shielding layer SM may be formed by photolithography and etching.

As shown in FIG. 3B, insulation layer IL1 is formed on the substrate 110. The insulation layer IL1 covers the shielding layer SM. In this embodiment, the material of the insulation layer IL1 may include an inorganic material, an organic material, or a combination thereof, wherein the inorganic material is, for example, but is not limited to: silicon oxide, silicon nitride, silicon oxynitride, or a stacked layer having at least two of the aforementioned materials, and the organic material is, for example, but is not limited to: a polyimide resin, an epoxy resin, an acrylate resin, or other polymer materials. Although the insulation layer IL1 is a single layer in this embodiment, the invention is not limited thereto. In other embodiments, the insulation layer IL1 may also be formed by a plurality of stacked film layers. In addition, in this embodiment, the insulation layer IL1 may be entirely deposited on the substrate 110 through physical vapor deposition (PVD) or chemical vapor deposition (CVD).

A semiconductor layer 120 is then formed on the substrate 110. In this embodiment, the semiconductor layer 120 includes semiconductor pattern 122, semiconductor pattern 124, and semiconductor pattern 126. In this embodiment, the material of the semiconductor layer 120 may include polysilicon. In this embodiment, the semiconductor layer 120 may be formed by photolithography and etching.

As shown in FIG. 3C, gate insulation layer GI is formed on the semiconductor layer 120, wherein the gate insulation layer GI covers the semiconductor layer 120. In this embodiment, the material of the gate insulation layer GI may include an inorganic material, an organic material, or a combination thereof, wherein the inorganic material is, for example, but is not limited to: silicon oxide, silicon nitride, silicon oxynitride, or a stacked layer having at least two of the aforementioned materials, and the organic material is, for example, but is not limited to: a polyimide resin, an epoxy resin, an acrylate resin, or other polymer materials. Although the gate insulation layer GI is a single layer in this embodiment, the invention is not limited thereto. In other embodiments, the gate insulation layer GI may also be formed by a plurality of stacked film layers. In addition, in this embodiment, the gate insulation layer GI may be entirely deposited on the substrate 110 through PVD or CVD.

A first conductor layer M1 is then formed on the gate insulation layer GI. In this embodiment, the first conductor layer M1 includes the gate G1 at the gate predetermined region GR1, the gate 20G at the gate predetermined region GR2, and a conductor pattern MP at the gate predetermined region GR3. In this embodiment, note that the first conductor layer M1 further includes the scan line SL, as shown in FIG. 4. In addition, with reference to FIG. 4, the first conductor layer M1 may further include conductor pattern MP2. In this embodiment, the material of the first conductor layer M1 may include metal. In this embodiment, the first conductor layer M1 may be formed by photolithography and etching. For instance, a method for forming the first conductor layer M1 may include, for example, performing the photolithography and etching process after a metal material layer is entirely formed on the gate insulation layer GI to pattern the metal material layer, wherein a method for forming the metal material layer may include metal-organic chemical vapor deposition (MOCVD) or PVD.

The first conductor layer M1 is then taken as a mask to perform an ion doping process on the semiconductor pattern 122, the semiconductor pattern 124, and the semiconductor pattern 126, so as to form a source doped region R1 and a drain doped region Q1 in the semiconductor pattern 122 and to define a channel region C1, to form a source doped region R2 and a drain doped region Q2 in the semiconductor pattern 124 and to define a channel region C2, and to form a source doped region R3 and a drain doped region Q3 in the semiconductor pattern 126 and to define a channel region C3. In this embodiment, the ion doping process may be performed by any method commonly known to people having ordinary skills in the art.

In this embodiment, the first conductor layer M1 is taken as the mask in the ion doping process, but the invention is not limited thereto. In other embodiments, the first conductor layer M1 and a mask layer used thereof may both be taken as the mask in the ion doping process when forming the first conductor layer M1. In addition, in this embodiment, the source doped regions R1-R3, the drain doped regions Q1-Q3, and the channel regions C1-C3 are formed after the first conductor layer M1 is formed, but the invention is not limited thereto. In other embodiments, the ion doping process may also be performed after the semiconductor layer 120 is formed and before the gate insulation layer GI is formed. In addition, in this embodiment, only the source doped region R1 and the drain doped region Q1 are formed in the semiconductor pattern 122, only the source doped region R2 and the drain doped region Q2 are formed in the semiconductor pattern 124, and only the source doped region R3 and the drain doped region Q3 are formed in the semiconductor pattern 126, but the invention is not limited thereto. In other embodiments, a source lightly doped region and a drain lightly doped region may also be formed respectively in the semiconductor pattern 122, the semiconductor pattern 124, and the semiconductor pattern 126, wherein the dopant of the source lightly doped region and of the drain lightly doped region is of the identical kind but has a different concentration from the concentration of the dopant of the source doped regions R1-R3 and the dopant of the drain doped regions Q1-Q3.

As shown in FIG. 3D, an interlayered insulation layer II is formed on the gate insulation layer GI. In this embodiment, the interlayered insulation layer II includes a first sublayer IIa and a second sublayer IIb disposed on the first sublayer IIa, wherein the material of the first sublayer IIa and the material of the second sublayer IIb are different and are selected from a group consisting of silicon nitride and silicon oxide. In addition, in this embodiment, the first sublayer IIa and the second sublayer IIb respectively have a thickness of approximately 500 Å to 4000 Å. According to an embodiment of the invention, the material of the first sublayer IIa is silicon nitride, and the first sublayer IIa has the thickness of approximately 500 Å to 4000 Å; the material of the second sublayer IIb is silicon oxide, and the second sublayer IIb has the thickness of approximately 500 Å to 4000 Å. In addition, in this embodiment, the first sublayer IIa and the second sublayer IIb may be entirely deposited on the gate insulation layer GI respectively through PVD or CVD.

As shown in FIG. 3E, an annealing process 130 is performed. In this embodiment, the annealing process 130 is, for example, rapid thermal processing (RTP). In this embodiment, the process temperature of the annealing process 130 is approximately 500° C. to 700° C., for example, and the process time of the annealing process 130 is approximately 1 to 5 minutes, for example. In this embodiment, by performing the annealing process 130, hydrogen ions in the interlayered insulation layer II may be diffused into the semiconductor layer 120 to hydrogenize the semiconductor layer 120, and defects of the semiconductor layer 120 generated when the ion doping process is performed may be repaired and thereby the semiconductor layer 120 may be activated effectively.

As shown in FIG. 3F, the interlayered insulation layer II at the gate predetermined region GR3 is removed after the annealing process 130 is performed to expose the conductor pattern MP at the gate predetermined region GR3. In this embodiment, a method for removing the interlayered insulation layer II at the gate predetermined region GR3 is, for example, dry etching or wet etching. In addition, in this embodiment, a portion of the gate insulation layer GI which is located at the gate predetermined region GR3 and is not covered by the conductor pattern MP may be removed while the interlayered insulation layer II at the gate predetermined region GR3 is being removed.

As shown in FIG. 3G, the first conductor layer M1 at the gate predetermined region GR3 is removed. In other words, the conductor pattern MP located at the gate predetermined region GR3 and exposed in the step described above is removed. In this embodiment, a method for removing the first conductor layer M1 at the gate predetermined region GR3 is, for example, dry etching or wet etching.

As shown in FIG. 3H, the gate 10G is formed at the gate predetermined region GR3. In this embodiment, the material of the gate 10G may be different from the material of the first conductor layer M1. In this embodiment, the gate 10G may be a transparent gate. In other words, the gate 10G at the gate predetermined region GR3 at least replaces the non-transparent conductor pattern MP which is originally at the gate predetermined region GR3. In this embodiment, the material of the gate 10G may include, but is not limited to: a metal oxide conductive material, such as indium tin oxide, indium zinc oxide, aluminum tin oxide, aluminum zinc oxide, or indium germanium zinc oxide. In this embodiment, the gate 10G may be formed by photolithography and etching.

As shown in FIG. 3I, a second conductor layer M2 is formed on the substrate 110. In this embodiment, the second conductor layer M2 includes the source S1, the drain D1, the source 20S, the drain 20D, the source 10S, and the drain 10D. In further detail, in this embodiment, the source S1 is electrically connected to the source doped region R1 of the semiconductor pattern 122 through a contact window V1 formed in the gate insulation layer GI, the first sublayer IIa, and the second sublayer IIb; the drain D1 is electrically connected to the drain doped region Q1 of the semiconductor pattern 122 through a contact window V2 formed in the gate insulation layer GI, the first sublayer IIa, and the second sublayer IIb; the source 20S is electrically connected to the source doped region R2 of the semiconductor pattern 124 through a contact window V3 formed in the gate insulation layer GI, the first sublayer IIa, and the second sublayer IIb; the drain 20D is electrically connected to the drain doped region Q2 of the semiconductor pattern 124 through a contact window V4 formed in the gate insulation layer GI, the first sublayer IIa, and the second sublayer IIb; the source 10S is electrically connected to the source doped region R3 of the semiconductor pattern 126 through a contact window V5 formed in the gate insulation layer GI, the first sublayer IIa, and the second sublayer IIb; the drain 10D is electrically connected to the drain doped region Q3 of the semiconductor pattern 126 through a contact window V6 formed in the gate insulation layer GI, the first sublayer IIa, and the second sublayer IIb. In addition, in this embodiment, the drain 20D and the source 10S constitute a continuously connected conductor pattern, i.e., the drain 20D and the source 10S are electrically connected to each other.

On the other hand, also as shown in FIG. 4, in this embodiment, the source S1 and the data line DL1 constitute a continuous conductor pattern, and the source S1, for example, may be a part of the data line DL1. The source 20S and the read-out line RL constitute a continuous conductor pattern, and the source 20S, for example, may be a part of the read-out line RL. The drain 10D and the sensing signal line BL constitute a continuous conductor pattern, and the drain 10D, for example, may be a part of the sensing signal line BL. Therefore, the second conductor layer M2 may further include the data line DL, the read-out line RL, and the sensing signal line BL. As shown in FIG. 4, note that the sensing signal line BL is electrically connected to the conductor pattern MP2 through a contact window V7. Furthermore, the conductor pattern MP2 may be in contact with the gate 10G, such that the sensing signal line BL is electrically connected to the gate 10G.

In this embodiment, based on consideration of electrical conductivity, the material of the second conductor layer M2 is generally a metal material including but not limited to aluminum, molybdenum, titanium, gold, indium, tin, or a combination thereof. However, the invention is not limited thereto. In other embodiments, the material of the second conductor layer M2 may also include but may not be limited to, for example, other conductive materials (such as alloy, metal nitride, metal oxide, metal oxynitride), or a stacked layer having a metal material and the aforesaid other conductive materials. In addition, in this embodiment, the second conductor layer M2 may be formed by photolithography and etching.

Note that the fabrication of the active element T1, the sensor 10, and the switch 20 is completed on the substrate 110. The active element T1 includes the gate G1, the source S1, the drain D1 and the semiconductor pattern 122 having the source doped region R1, the drain doped region Q1, and the channel region C1; the sensor 10 includes the gate 10G, the source 10S, the drain 10D, and the semiconductor pattern 126 having the source doped region R3, the drain doped region Q3, and the channel region C3; the switch 20 includes the gate 20G, the source 20S, the drain 20D, and the semiconductor pattern 124 having the source doped region R2, the drain doped region Q2, and the channel region C2.

From another point of view, in this embodiment, each of the active element T1, the sensor 10, and the switch 20 has a top-gate thin film transistor (TFT) structure. In addition, as described above, the material of the semiconductor layer 120 may include polysilicon, such that the active element T1, the sensor 10, and the switch 20 may be low-temperature polysilicon TFTs. In addition, as described above, the drain 10D and the sensing signal line BL may constitute a continuous conductor pattern, such that the sensor 10 is electrically connected to the sensing signal line BL. Besides, as described above, the drain 20D and the source 10S are electrically connected to each other, such that the sensor 10 is electrically connected to the switch 20. Moreover, as described above, the gate G1, the gate 20G, and the scan line SL constitute a continuous conductor pattern, such that the active element T1 is electrically connected to the switch 20.

As shown in FIG. 3J, planarization layer PL is formed on the gate 10G and the interlayered insulation layer II to provide the function of protecting the active element T1, the sensor 10, and the switch 20 or/and provide the function of planarization. In this embodiment, the material of the planarization layer PL may include an inorganic material, an organic material, or a combination thereof, wherein the inorganic material is, for example, but is not limited to: silicon oxide, silicon nitride, silicon oxynitride, or a stacked layer having at least two of the aforementioned materials, and the organic material is, for example, but is not limited to: a polyimide resin, an epoxy resin, an acrylate resin, or other polymer materials. Although the planarization layer PL is a single layer in this embodiment, the invention is not limited thereto. In other embodiments, the planarization layer PL may also be formed by a plurality of stacked film layers. In addition, in this embodiment, the planarization layer PL may be entirely deposited on the substrate 110 through PVD, CVD, or photoresist coating.

A common electrode CM is then formed on the planarization layer PL. In detail, the common electrode CM has an opening O to expose a portion of the planarization layer PL. In addition, the common electrode CM is electrically connected to the common voltage Vcom. In this embodiment, the material of the common electrode CM may include, but is not limited to: a transparent metal oxide conductive material, such as indium tin oxide, indium zinc oxide, aluminum tin oxide, aluminum zinc oxide, or indium germanium zinc oxide. In addition, in this embodiment, the common electrode CM may be formed by photolithography and etching.

As shown in both FIG. 3K and FIG. 4, insulation layer IL2 is formed on the planarization layer PL and the common electrode CM. In detail, the insulation layer IL2 covers the common electrode CM and fills the opening O. In this embodiment, the material of the insulation layer IL2 may include an inorganic material, an organic material, or a combination thereof, wherein the inorganic material is, for example, but is not limited to: silicon oxide, silicon nitride, silicon oxynitride, or a stacked layer having at least two of the aforementioned materials, and the organic material is, for example, but is not limited to: a polyimide resin, an epoxy resin, an acrylate resin, or other polymer materials. Although the insulation layer IL2 is a single layer in this embodiment, the invention is not limited thereto. In other embodiments, the insulation layer IL2 may also be formed by a plurality of stacked film layers. In addition, in this embodiment, the insulation layer IL2 may be entirely deposited on the planarization layer PL and the common electrode CM through PVD or CVD.

A pixel electrode PE electrically connected to the drain D1 is then formed. In this embodiment, the pixel electrode PE is electrically connected to the drain D1 of the active element T1 through contact window V8 formed in the planarization layer PL and the insulation layer IL2. In addition, in this embodiment, the pixel electrode PE may include frame C and bar-shaped electrodes E connected to and inside the frame C, wherein slits ST are formed between two adjacent bar-shaped electrodes E or/and between a portion of the frame C and the bar-shaped electrode E. In other words, the pixel electrode PE may be a patterned electrode. In addition, in this embodiment, the pixel electrode PE and the common electrode CM form the capacitor Cst1, and the insulation layer IL2 between the pixel electrode PE and the common electrode CM serves as a capacitor insulation layer of the capacitor Cst1.

In this embodiment, the material of the pixel electrode PE may include, but is not limited to: a transparent metal oxide conductive material, such as indium tin oxide, indium zinc oxide, aluminum tin oxide, aluminum zinc oxide, or indium germanium zinc oxide. In addition, in this embodiment, the pixel electrode PE may be formed by photolithography and etching.

The fabrication of the sub-pixel unit P1 of the touch display device 100 according to the first embodiment of the invention is completed, wherein the sub-pixel unit P1 includes the active element T1, the sensor 10, the switch 20, the pixel electrode PE, and the capacitor Cst1. In the present embodiment, the touch display device 100 may adopt an advanced hyper-viewing angle (AHVA) technology or a fringe field switching (FFS) technology. In addition, to clearly illustrate and describe the arrangement of each component in the touch display device 100, the substrate 110, the shielding layer SM, the insulation layer IL1, the interlayered insulation layer II, the planarization layer PL, and the insulation layer IL2 are omitted in FIG. 4.

According to the Inventors' discovery, after the gate, of which the material includes a transparent metal oxide conductive material, is under the rapid thermal processing, the issue of reduction and precipitation of metal atoms (such as indium) may occur, thus resulting in poor light transmittance; or the issue of peeling may occur, thus resulting in poor structural stability. It is also discovered that, by adjusting the conditions of the rapid thermal processing, the issue of reduction and precipitation of metal atoms as well as the issue of peeling may not easily occur on the transparent gate, resulting in that the deficient hydrogenation and activation of the semiconductor layer may occur such that the carrier mobility of the TFT is reduced. In light of the above, in the method for fabricating the touch display device 100 according to this embodiment, the gate 10G is formed after the annealing process 130 is completed, and the annealing process 130 is performed after the interlayered insulation layer II is formed. Thereby, not only the semiconductor layer 120 may be hydrogenized and activated effectively, but also the gate 10G does not encounter reduction and precipitation of metal atoms and the issue of peeling. Accordingly, in the touch display device 100 according to this embodiment, the sensor 10 may have good carrier mobility, luminous flux, and structural stability and thereby have good sensing performance.

Figure 5:
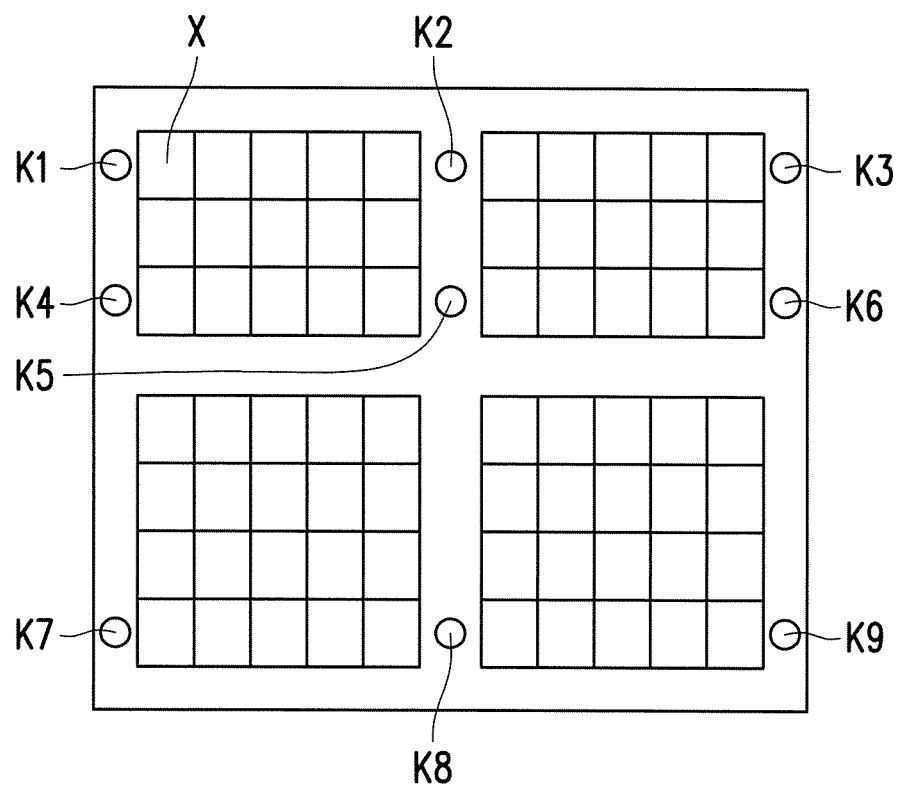
FIG. 5 is a schematic top view of a motherboard for performing an electrical test.
Figure 6:
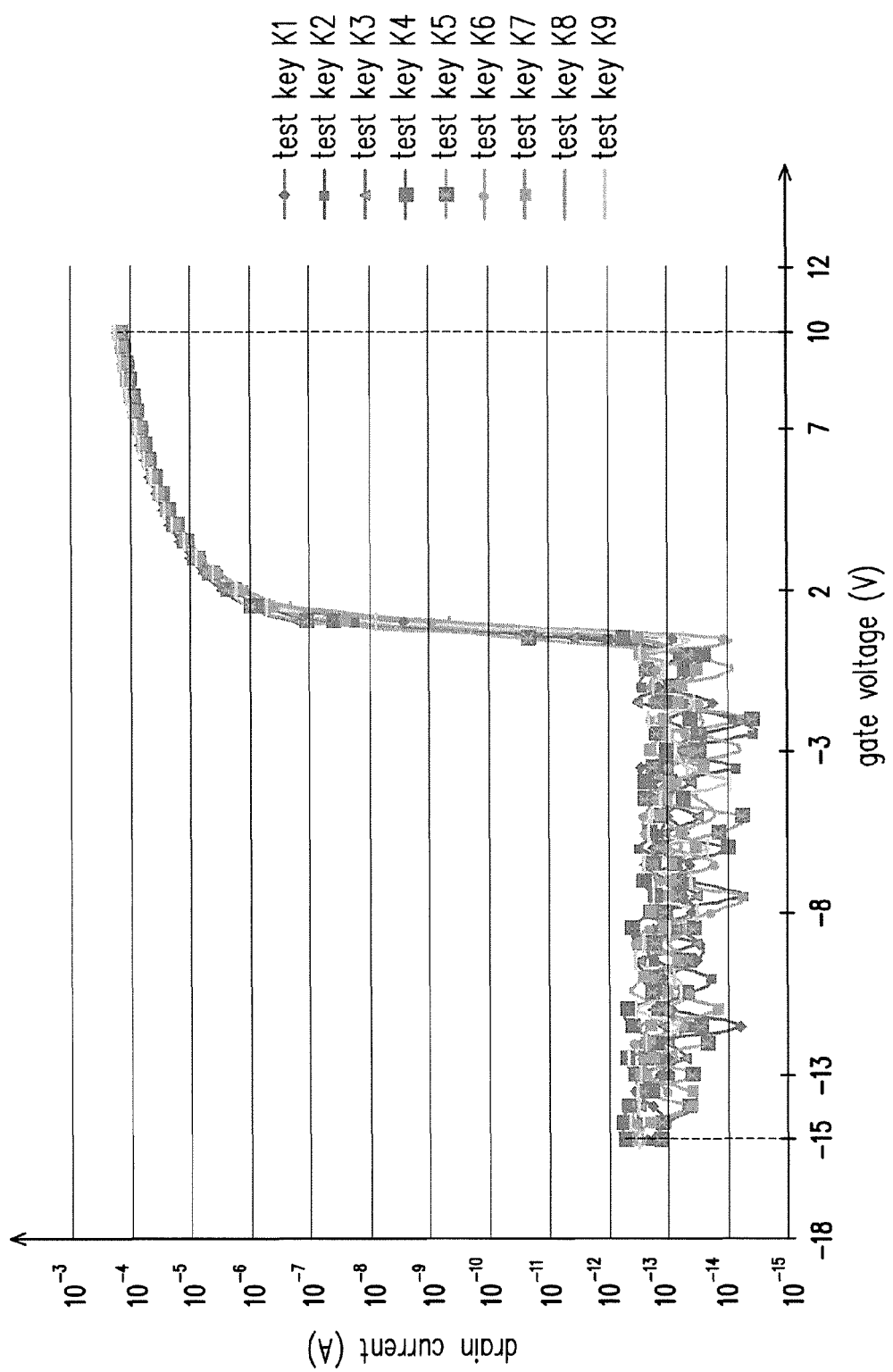
FIG. 6 is a curve diagram of a current-voltage relationship of the nine test keys K1-K9 depicted in FIG. 5.

Furthermore, it may be proven by the following experiments that the electrical property performance of the touch display device 100 is stable according to this embodiment. As shown in FIG. 5, according to the method for performing the electrical property test, the electrical property test is performed on nine test keys K1-K9 which are set on a motherboard 1000 having a plurality of touch display units X. The test keys K1-K9 and the touch display units X are simultaneously formed and the test keys K1-K9 have the identical structure as that of the pixel unit U, such that the electrical property performance of the pixel unit U may be learned from measuring the electrical property of the test keys K1-K9. In detail, the condition of performing the electrical property test is to apply a drain voltage of 10 V, and the results of the electrical property test are shown in FIG. 6. After the electrical property test is performed, note that a cutting process is performed to the motherboard 1000 to cut off the touch display units X, so as to form a plurality of touch display devices 100. According to FIG. 6, the curves showing the current-voltage relationship obtained from the nine test keys K1-K9 are of good superimposition. Since the test keys K1-K9 and the touch display units X are simultaneously formed, and a plurality of touch display devices 100 are formed after the cutting process is performed to the motherboard 1000, it is proven that the touch display device provided in the embodiment of the invention has good electrical property, manufacturing yield, and uniformity.

In addition, in light of FIG. 1 and the descriptions of all the above steps (i.e., as shown in FIG. 3A to FIG. 3K), people having ordinary skills in the art should be able to understand that, in the touch display device 100, the pixel electrode and the active element T2 of the sub-pixel unit P2 may respectively have the structure identical or similar to that of the pixel electrode PE and the active element T1 of the sub-pixel unit P1, and the pixel electrode and the active element T3 of the sub-pixel unit P3 may respectively have the structure identical or similar to that of the pixel electrode PE and the active element T1 of the sub-pixel unit P1. In detail, in the method for fabricating the touch display device 100 according to this embodiment, the gate G2, the gate G3, and the gate G1 are formed in the same photolithography and etching process, the sources S2-S3, the drains D2-D3, the source S1, and the drain D1 are formed in the same photolithography and etching process, and the pixel electrodes in the sub-pixel units P2-P3 and the pixel electrode PE in the sub-pixel unit P1 are formed in the same photolithography and etching process.

In addition, in this embodiment, the configuration of the pixel electrode PE is not limited to what is shown in FIG. 4. In other words, the pixel electrode PE may be an electrode having any configuration applied in the AHVA technology or a FFS technology, as well known to people having ordinary skills in the art. For example, although the bar-shaped electrodes E are shaped as vertical straight lines in FIG. 4, the bar-shaped electrodes E may be shaped as "<<", waves, parallel lines, or in other suitable manner according to other embodiments. In another example, although the pixel electrode PE has three bar-shaped electrodes E in FIG. 3, the number of bar-shaped electrodes E may be adjusted according to the actual need of the display panel in other embodiments. In another example, although the frame C is in a rectangular shape in FIG. 4, the frame C may be shaped as an inverted letter U, a letter L, two parallel straight lines, or in other suitable manner in other embodiments.

Figure 7A:
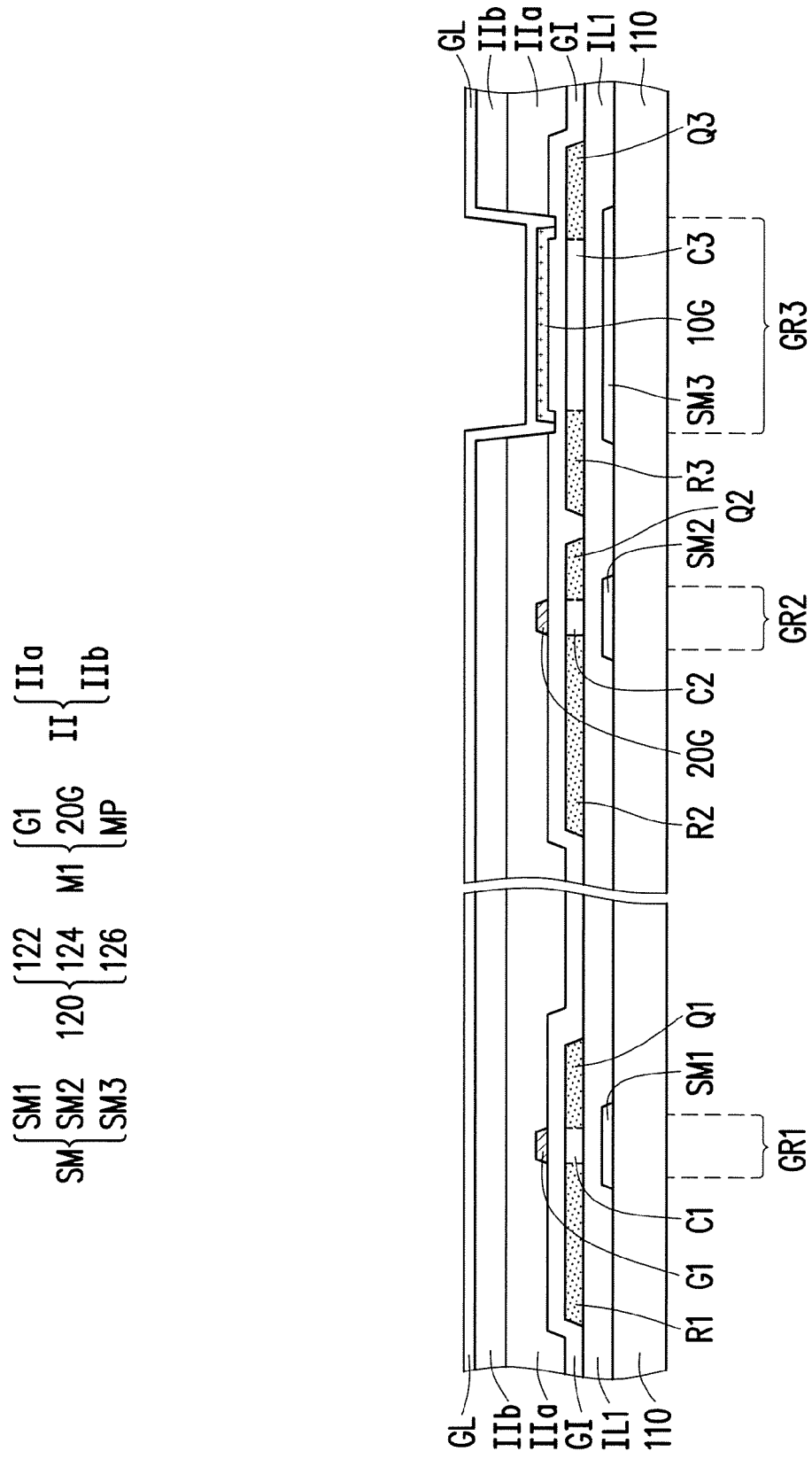
FIG. 7A to FIG. 7D are schematic cross-sectional views of a process for fabricating a touch display device according to a second embodiment of the invention.

FIG. 7A to FIG. 7D are schematic cross-sectional views of a process for fabricating a touch display device according to a second embodiment of the invention, wherein FIG. 7A shows a process which follows the steps depicted in FIG. 3H. In other words, the cross-section of FIG. 7A to FIG. 7D may be located according to the position of the sectional line A-A' and the sectional line B-B' in FIG. 4. It should be noted that the reference numerals and some descriptions provided in the first embodiment are applicable in the second embodiment, in which identical or similar reference numerals indicate identical or similar components and film layers, and repeated descriptions of the same technical contents are omitted. Please refer to the descriptions provided in the first embodiment for the omitted contents, which will not be repeated hereinafter. The following descriptions will be provided in regard to the differences between the second embodiment and the first embodiment.

As shown in FIG. 7A, protective layer GL is formed on the gate 10G and the interlayered insulation layer II to cover the gate 10G. In this embodiment, the material of the protective layer GL is selected from a group consisting of silicon nitride and silicon oxide. In addition, in this embodiment, the protective layer GL has a thickness of approximately 500 Å to 4000 Å. According to an embodiment of the invention, the material of the protective layer GL is silicon oxide, and the protective layer GL has the thickness of approximately 500 Å to 4000 Å. In another embodiment, the material of the protective layer GL is silicon nitride, and the protective layer GL has the thickness of approximately 500 Å to 4000 Å. In addition, in this embodiment, the protective layer GL may be entirely deposited on the gate 10G and the interlayered insulation layer II through PVD or CVD.

Figure 7B:
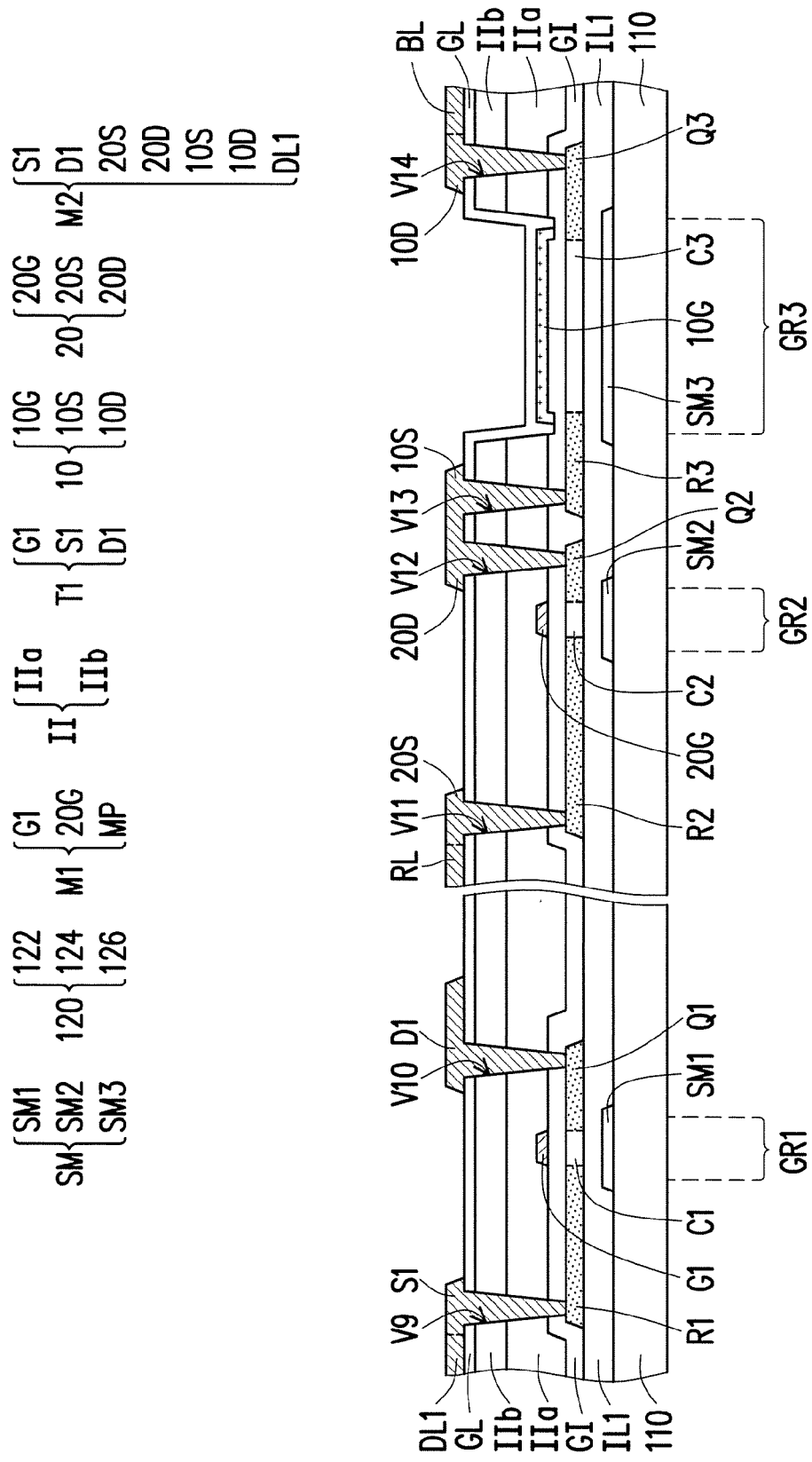

As shown in FIG. 7B, second conductor layer M2 is formed on the substrate 110, and the second conductor layer M2 includes the source S1, the drain D1, the source 20S, the drain 20D, the source 10S, and the drain 10D. In detail, in this embodiment, the source S1 is electrically connected to the source doped region R1 of the semiconductor pattern 122 through contact window V9 formed in the gate insulation layer GI, the first sublayer IIa, the second sublayer IIb, and the protective layer GL; the drain D1 is electrically connected to the drain doped region Q1 of the semiconductor pattern 122 through contact window V10 formed in the gate insulation layer GI, the first sublayer IIa, the second sublayer IIb, and the protective layer GL; the source 20S is electrically connected to the source doped region R2 of the semiconductor pattern 124 through contact window V11 formed in the gate insulation layer GI, the first sublayer IIa, the second sublayer IIb, and the protective layer GL; the drain 20D is electrically connected to the drain doped region Q2 of the semiconductor pattern 124 through contact window V12 formed in the gate insulation layer GI, the first sublayer IIa, the second sublayer IIb, and the protective layer GL; the source 10S is electrically connected to the source doped region R3 of the semiconductor pattern 126 through contact window V13 formed in the gate insulation layer GI, the first sublayer IIa, the second sublayer IIb, and the protective layer GL; the drain 10D is electrically connected to the drain doped region Q3 of the semiconductor pattern 126 through contact window V14 formed in the gate insulation layer GI, the first sublayer IIa, the second sublayer IIb, and the protective layer GL.

In the process of forming the second conductor layer M2 in this embodiment, note that the gate 10G is covered by the protective layer GL, and the short circuit resulting from the contact between the gate 10G and the second conductor layer M2 due to process errors may be prevented thereby.

In addition, the fabrication of the active element T1, the sensor 10, and the switch 20 is hereby completed on the substrate 110, and the active element T1 includes the gate G1, the source S1, the drain D1, and the semiconductor pattern 122 having the source doped region R1, the drain doped region Q1, and the channel region C1; the sensor 10 includes the gate 10G, the source 10S, the drain 10D, and the semiconductor pattern 126 having the source doped region R3, the drain doped region Q3, and the channel region C3; the switch 20 includes the gate 20G, the source 20S, the drain 20D, and the semiconductor pattern 124 having the source doped region R2, the drain doped region Q2, and the channel region C2.

Figure 7C:
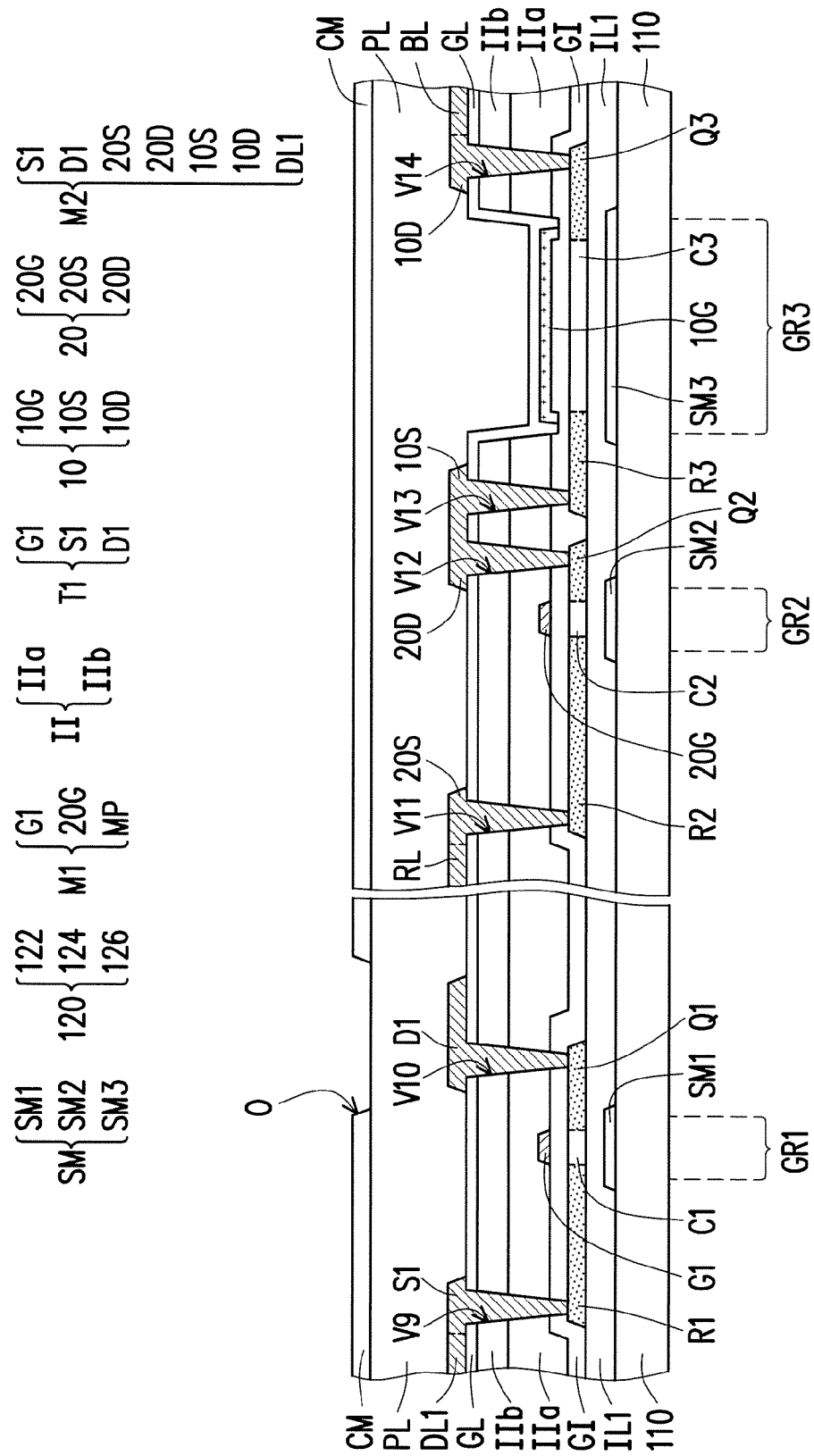

As shown in FIG. 7C, after a planarization layer PL is formed on the second conductor layer M2 and the protective layer GL, common electrode CM is formed on the planarization layer PL. The planarization layer PL has direct contact with the protective layer GL in this embodiment.

Figure 7D:
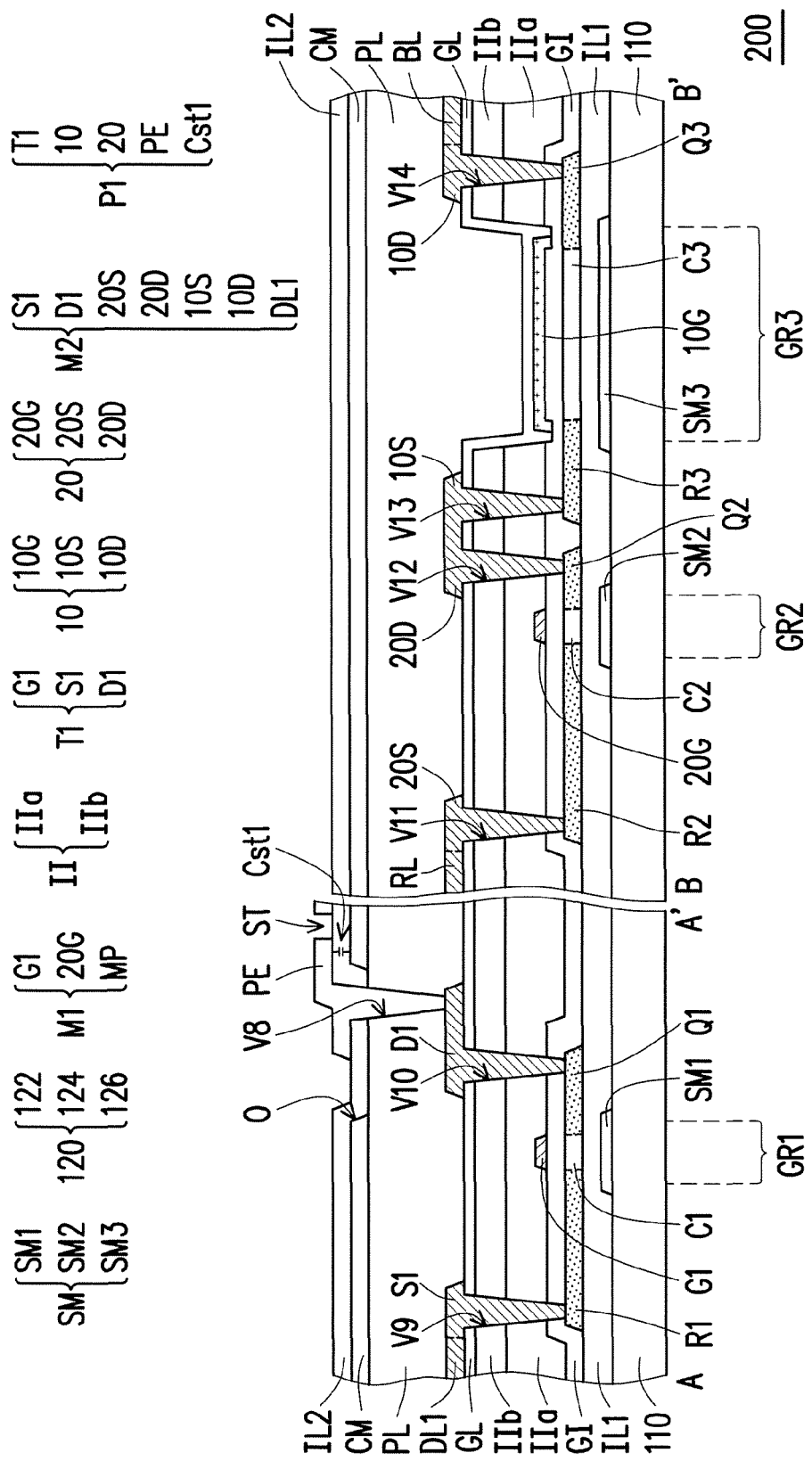

As shown in FIG. 7D, after insulation layer IL2 is formed on the planarization layer PL and the common electrode CM, pixel electrode PE electrically connected to the drain D1 is formed.

The fabrication of the sub-pixel unit P1 of a touch display device 200 provided in the second embodiment of the invention is hereby completed, wherein the sub-pixel unit P1 includes the active element T1, the sensor 10, the switch 20, the pixel electrode PE, and the capacitor Cst1. The touch display device 200 may apply an AHVA technology or a FFS technology according to this embodiment.

In light of the first embodiment and the second embodiment, in the method for fabricating the touch display device 200, the gate 10G is formed after the annealing process 130 is completed, and the annealing process 130 is performed after the interlayered insulation layer II is formed. Thereby, not only the semiconductor layer 120 may be hydrogenized and activated effectively, but also the gate 10G does not encounter the issue of reduction and precipitation of metal atoms and the issue of peeling. Accordingly, in the touch display device 200, the sensor 10 may have good carrier mobility, luminous flux, and structural stability and thereby have good sensing performance.

In addition, in light of FIG. 1 and the descriptions of the first embodiment and the second embodiment, people having ordinary skills in the art should be able to understand that, in the touch display device 200, the pixel electrode and the active element T2 of the sub-pixel unit P2 may respectively have the structure identical or similar to that of the pixel electrode PE and the active element T1 of the sub-pixel unit P1, and the pixel electrode and the active element T3 of the sub-pixel unit P3 may respectively have the structure identical or similar to that of the pixel electrode PE and the active element T1 of the sub-pixel unit P1. In detail, in the method for fabricating the touch display device 200 according to this embodiment, the gate G2, the gate G3, and the gate G1 are formed in the same photolithography and etching process, the sources S2-S3, the drains D2-D3, the source S1, and the drain D1 are formed in the same photolithography and etching process, and the pixel electrodes in the sub-pixel units P2-P3 and the pixel electrode PE in the sub-pixel unit P1 are formed in the same photolithography and etching process.

Figure 8A:
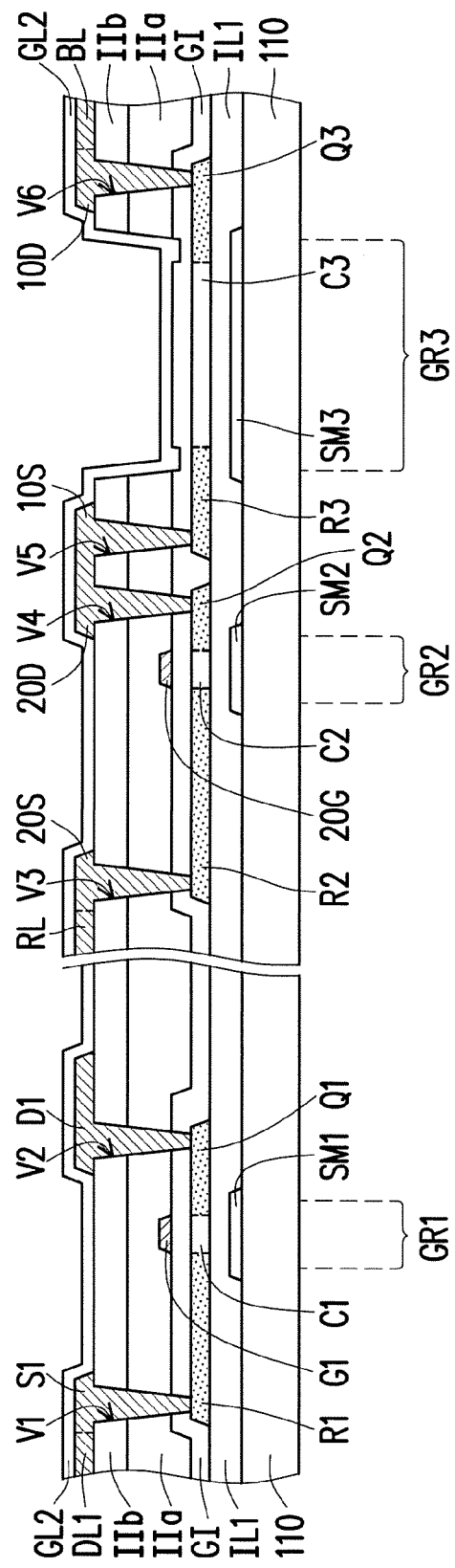
FIG. 8A to FIG. 8D are schematic cross-sectional views of a process for fabricating a touch display device according to a third embodiment of the invention.

FIG. 8A to FIG. 8D are schematic cross-sectional views of a process for fabricating a touch display device according to a third embodiment of the invention, wherein FIG. 8A shows a process which follows the steps depicted in FIG. 3G. In other words, the cross-section of FIG. 8A to FIG. 8D may be located according to the position of the sectional line A-A' and the sectional line B-B' in FIG. 4. It should be noted that the reference numerals and some descriptions of the first embodiment are applicable in the third embodiment, in which identical or similar reference numerals indicate identical or similar components and film layers, and repeated descriptions of the same technical contents are omitted. Please refer to the description of the first embodiment for the omitted contents, which will not be repeated hereinafter. The following descriptions will be provided in regard to the differences between the third embodiment and the first embodiment.

As shown in FIG. 8A, second conductor layer M2 is formed on the substrate 110, and the second conductor layer M2 includes the source S1, the drain D1, the source 20S, the drain 20D, the source 10S, and the drain 10D.

Note that the fabrication of the active element T1 and the switch 20 is completed on the substrate 110. Here, the active element T1 includes the gate G1, the source S1, the drain D1, and the semiconductor pattern 122 having the source doped region R1, the drain doped region Q1, and the channel region C1, and the switch 20 includes the gate 20G, the source 20S, the drain 20D, and the semiconductor pattern 124 having the source doped region R2, the drain doped region Q2, and the channel region C2.

A protective layer GL2 is then formed on the second conductor layer M2 to cover the second conductor layer M2. In this embodiment, the material of the protective layer GL2 is selected from a group consisting of silicon nitride and silicon oxide. In addition, in this embodiment, the protective layer GL2 has a thickness of approximately 500 Å to 4000 Å. According to an embodiment of the invention, the material of the protective layer GL2 is silicon oxide, and the protective layer GL2 has the thickness of approximately 500 Å to 4000 Å. In another embodiment, the material of the protective layer GL2 is silicon nitride, and the protective layer GL2 has the thickness of approximately 500 Å to 4000 Å. Besides, in this embodiment, the protective layer GL2 may be entirely deposited on the second conductor layer M2 through PVD or CVD.

Figure 8B:
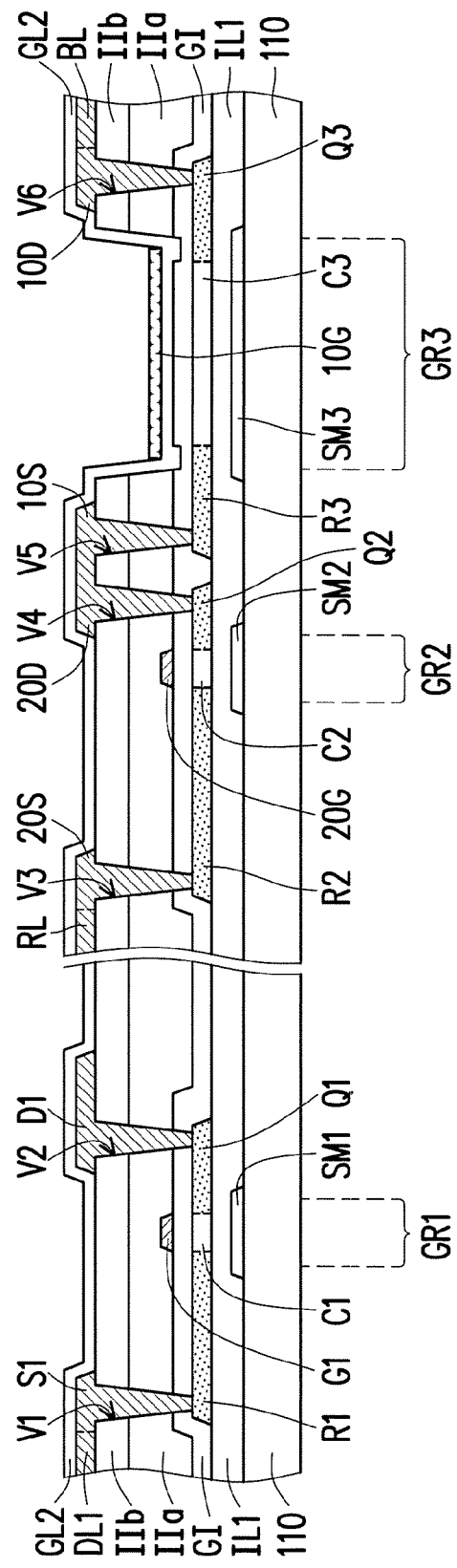

As shown in FIG. 8B, the gate 10G is formed at the gate predetermined region GR3. In this embodiment, the gate 10G is formed on the protective layer GL2.

In the process of forming the gate 10G in this embodiment, note that the second conductor layer M2 is covered by the protective layer GL2, and the short circuit resulting from the contact between the gate 10G and the second conductor layer M2 due to process errors may be prevented thereby.

In addition, the fabrication of the sensor 10 is completed on the substrate 110, and the sensor 10 includes the gate 10G, the source 10S, the drain 10D, and the semiconductor pattern 126 having the source doped region R3, the drain doped region Q3, and the channel region C3.

Figure 8C:
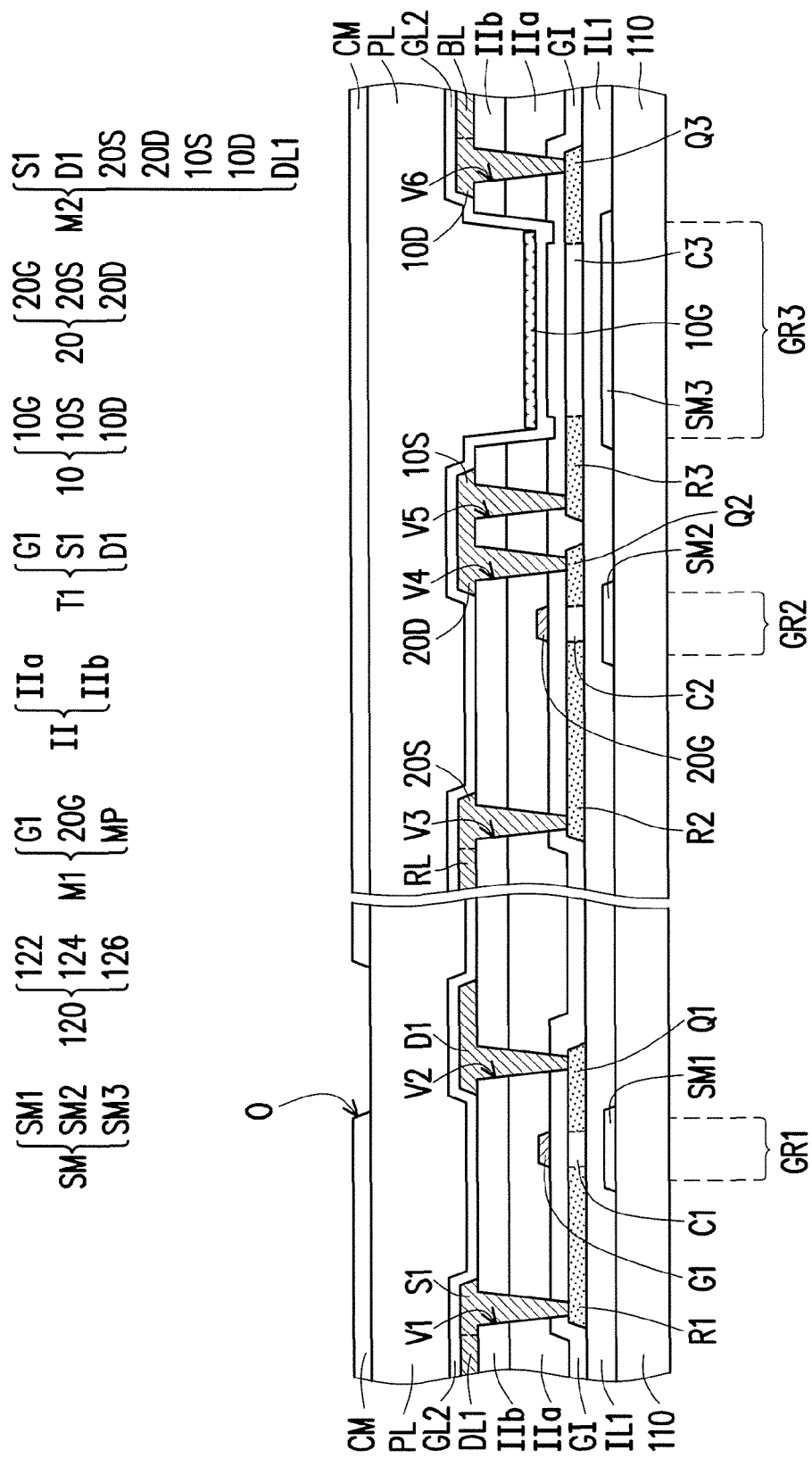

As shown in FIG. 8C, after planarization layer PL is formed on the gate 10G and the protective layer GL2, common electrode CM is formed on the planarization layer PL. The planarization layer PL has direct contact with the protective layer GL2 and the gate 10G in this embodiment.

Figure 8D:
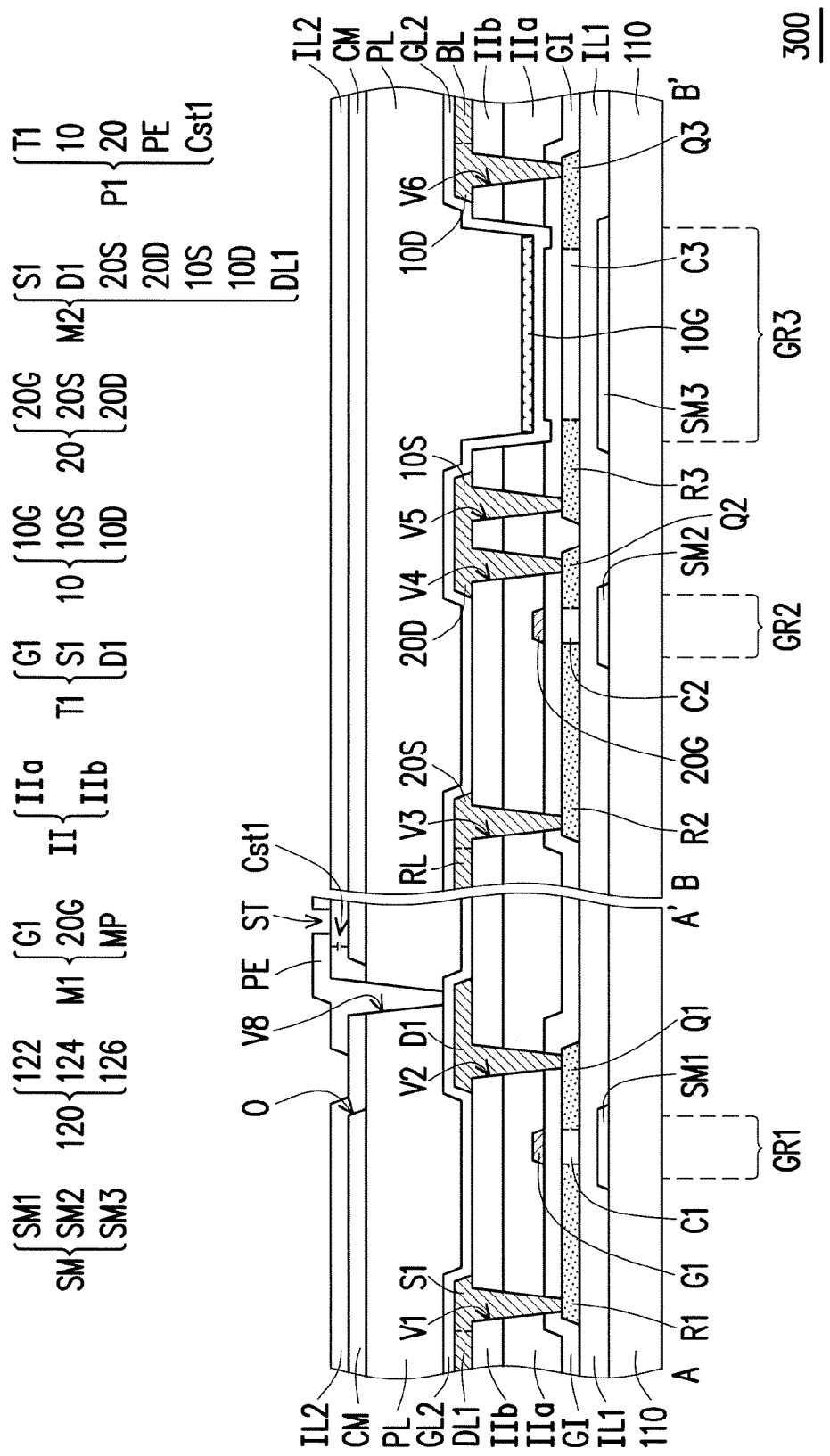

As shown in FIG. 8D, after insulation layer IL2 is formed on the planarization layer PL and the common electrode CM, pixel electrode PE electrically connected to the drain D1 is formed.

The fabrication of the sub-pixel unit P1 of a touch display device 300 according to the third embodiment of the invention is completed, and the sub-pixel unit P1 includes the active element T1, the sensor 10, the switch 20, the pixel electrode PE, and the capacitor Cst1. The touch display device 300 may apply an AHVA technology or a FFS technology according to this embodiment.

In light of the first embodiment and the third embodiment, in the method for fabricating the touch display device 300 according to this embodiment, the gate 10G is formed after the annealing process 130 is completed, and the annealing process 130 is performed after the interlayered insulation layer II is formed. Thereby, not only the semiconductor layer 120 may be hydrogenized and activated effectively, but also the gate 10G does not encounter the issue of reduction and precipitation of metal atoms and the issue of peeling. Accordingly, in the touch display device 300 according to this embodiment, the sensor 10 may have good carrier mobility, luminous flux, and structural stability and thereby have good sensing performance.

In addition, in light of FIG. 1 and the descriptions of the first embodiment and the third embodiment, people having ordinary skills in the art should be able to understand that, in the touch display device 300, the pixel electrode and the active element T2 of the sub-pixel unit P2 may respectively have the structure identical or similar to that of the pixel electrode PE and the active element T1 of the sub-pixel unit P1, and the pixel electrode and the active element T3 of the sub-pixel unit P3 may respectively have the structure identical or similar to that of the pixel electrode PE and the active element T1 of the sub-pixel unit P1. In the method for fabricating the touch display device 300 according to this embodiment, the gate G2, the gate G3, and the gate G1 are formed in the same photolithography and etching process, the sources S2-S3, the drains D2-D3, the source S1, and the drain D1 are formed in the same photolithography and etching process, and the pixel electrodes in the sub-pixel units P2-P3 and the pixel electrode PE in the sub-pixel unit P1 are formed in the same photolithography and etching process.

To sum up, in the method for fabricating the touch display device according to the embodiments of the invention, the gate of the sensor is formed after the annealing process is completed, and the annealing process is performed after the interlayered insulation layer is formed. Thereby, not only the semiconductor layer may be hydrogenized and activated effectively, but also the gate of the sensor does not encounter the issue of reduction and precipitation of metal atoms and the issue of peeling. Accordingly, in the touch display device of the invention, the sensor may have good carrier mobility, luminous flux, and structural stability and thereby have good sensing performance.

It will be apparent to those skilled in the art that various modifications and variations may be made to the disclosed embodiments without departing from the scope or spirit of this invention. In view of the foregoing, it is intended that the invention covers modifications and variations provided that they fall within the scope of the following claims and their equivalents.

What is claimed is:

1. A method for fabricating a touch display device, comprising:
    forming a sensor on a substrate, wherein a method of forming the sensor comprises:
        forming a semiconductor layer on the substrate, wherein the semiconductor layer comprises a semiconductor pattern;
        forming a gate insulation layer on the semiconductor layer;
        forming a first conductor layer on the gate insulation layer;
        forming an interlayered insulation layer on the gate insulation layer;
        performing an annealing process;
        removing the interlayered insulation layer at a gate predetermined region after performing the annealing process;
        removing the first conductor layer at the gate predetermined region;
        forming a gate at the gate predetermined region; and forming a second conductor layer, wherein the second conductor layer comprises a source of the sensor and a drain of the sensor, and the source and the drain of the sensor are respectively electrically connected to the semiconductor pattern of the sensor; and forming a sensing signal line electrically connected to the sensor.

2. The method for fabricating the touch display device according to claim 1, wherein the interlayered insulation layer comprises:

a first sublayer; and a second sublayer disposed on the first sublayer, wherein a material of the first sublayer and a material of the second sublayer are different, and the material of the first sublayer and the material of the second sublayer are selected from a group consisting of silicon nitride and silicon oxide.

3. The method for fabricating the touch display device according to claim 2, wherein the material of the first sublayer is silicon nitride, the first sublayer has a thickness of approximately 500 Å to 4000 Å, the material of the second sublayer is silicon oxide, and the second sublayer has a thickness of approximately 500 Å to 4000 Å.

4. The method for fabricating the touch display device according to claim 1, after forming the gate, the method further comprising:

forming a protective layer on the gate and the interlayered insulation layer.

5. The method for fabricating the touch display device according to claim 4, wherein a material of the protective layer is selected from a group consisting of silicon nitride and silicon oxide, and the protective layer has a thickness of approximately 500 Å to 4000 Å.

6. The method for fabricating the touch display device according to claim 1, before forming the gate, the method further comprising:

forming a protective layer on the second conductor layer.

7. The method for fabricating the touch display device according to claim 6, wherein a material of the protective layer is selected from a group consisting of silicon nitride and silicon oxide, and the protective layer has a thickness of approximately 500 Å to 4000 Å.

8. The method for fabricating the touch display device according to claim 1, further comprising:

forming a switch on the substrate, wherein the switch is electrically connected to the sensor.

9. The method for fabricating the touch display device according to claim 8, further comprising:

forming an active element on the substrate, wherein the active element is electrically connected to the switch.

10. The method for fabricating the touch display device according to claim 9, wherein the semiconductor pattern of the sensor, a semiconductor pattern of the switch, and a semiconductor pattern of the active element form the semiconductor layer, the source and the drain of the sensor, a source of the switch, a drain of the switch, a source of the active element, a drain of the active element, the sensing signal line, a read-out line, and a data line form the second conductor layer, and when forming the first conductor layer on the gate insulation layer, a conductor pattern on the gate predetermined region, a gate of the switch, a gate of the active element, and a scan line form the first conductor layer.

11. The method for fabricating the touch display device according to claim 10, wherein the drain and the gate of the sensor are electrically connected to the sensing signal line, the source of the sensor is electrically connected to the drain of the switch, the gate of the switch is electrically connected to the scan line, the source of the switch is electrically connected to the read-out line, the gate of the active element is electrically connected to the scan line, and the source of the active element is electrically connected to the data line.

12. The method for fabricating the touch display device according to claim 10, further comprising:

forming a pixel electrode electrically connected to the drain of the active element.

\* \* \* \* \*